United States Patent
Iwase et al.

(10) Patent No.: US 6,762,617 B2
(45) Date of Patent: Jul. 13, 2004

(54) SEMICONDUCTOR DEVICE HAVING TEST MODE ENTRY CIRCUIT

(75) Inventors: Akihiro Iwase, Kasugai (JP); Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/321,460

(22) Filed: Dec. 18, 2002

(65) Prior Publication Data

US 2003/0085731 A1 May 8, 2003

Related U.S. Application Data

(62) Division of application No. 09/504,795, filed on Feb. 15, 2000, now Pat. No. 6,651,196.

(30) Foreign Application Priority Data

Feb. 16, 1999 (JP) ............................................. 11-037570
Feb. 16, 1999 (JP) ............................................. 11-037571

(51) Int. Cl.[7] .................. H03K 19/003; G01R 31/3181
(52) U.S. Cl. ............................... 326/11; 326/16; 326/8; 714/724; 714/718; 714/733
(58) Field of Search ................. 326/8–16; 714/724–725

(56) References Cited

U.S. PATENT DOCUMENTS

| | | | |
|---|---|---|---|
| 4,375,683 A | * 3/1983 | Wensley ........................ 714/12 |
| 5,727,000 A | 3/1998 | Pizzica | |
| 5,784,383 A | 7/1998 | Meaney | |
| 5,787,096 A | 7/1998 | Roberts et al. ............. 371/21.1 |
| 6,005,814 A | 12/1999 | Mulholland et al. ........ 365/201 |
| 6,052,769 A | 4/2000 | Huff et al. ...................... 712/3 |
| 6,104,211 A | * 8/2000 | Alfke ........................... 326/91 |
| 6,480,019 B2 | * 11/2002 | Waldie et al. ................. 326/16 |
| 6,614,257 B2 | * 9/2003 | Knowles ......................... 329/9 |

FOREIGN PATENT DOCUMENTS

| | | |
|---|---|---|
| JP | 6-273495 | 9/1994 |
| JP | 8-077134 | 3/1996 |
| JP | 8-185331 | 7/1996 |
| JP | 11-149771 | 6/1999 |

* cited by examiner

*Primary Examiner*—Vibol Tan
(74) *Attorney, Agent, or Firm*—Arent Fox, PLLC

(57) ABSTRACT

A semiconductor device has a normal operation mode and a test mode. A decision circuit determines whether the device has entered the test mode. A control circuit changes information related to the normal operation mode when a test mode has been entered. If the test mode is accidentally entered, then because the information related to normal operation has been changed, a user can readily determine that the device has entered the test mode.

15 Claims, 18 Drawing Sheets

SEMICONDUCTOR DEVICE HAVING TEST MODE ENTRY CIRCUIT

This is a Division of application Ser. No. 09/504,795 filed Feb. 15, 2000 now U.S. Pat. No. 6,651,196. The disclosure of the prior application(s) is hereby incorporated by reference herein in its entirety.

BACKGROUND OF THE INVENTION

The present invention relates to a semiconductor device, and more particularly, to a semiconductor device which enters a test mode in accordance with a test command.

In a product test, before shipment of a semiconductor device, there is a method which makes a semiconductor memory unit enter a test mode by applying a higher voltage (the so-called super-high voltage) than usual to an input pin. In the test mode, various commands and data are input to the unit and a test is executed. This method is called the super-high voltage impression method. This method requires a circuit for detecting the super-high voltage. The circuit impedes high density integration and reduction of the total circuit area. Another method sets a test mode using a special address not used by the user. For example, a command (the so-called illegal command), whose use is prohibited by the user is used as the test mode entry command.

A semiconductor memory unit, such as a synchronous dynamic random access memory (SDRAM) and a fast cycle dynamic random access memory, detects a command using a chip selection signal, a row address strobe signal, a column address strobe signal and a write enable signal, which are supplied from an external device synchronously with an external clock signal. The memory unit operates in accordance with the command. In the SDRAM, for example, a mode register set command (MRS) is indicated by the chip selection signal. Various test modes, such as a counter test and a high load test for a cell plate, are set in a mode register by the mode register set command and memory address signals A0 to An.

The memory address signals A0 to An used for specifying various test modes do not include the memory address signals A0 to An used for setting the operation mode of a mode register set command, such as burst length and CAS latency. That is, address patterns (illegal patterns) whose use is prohibited by the user are used as the memory address signals A0 to An which specify the various test modes. For example, when both a memory address signal A7 and a memory address signal A8 are high, a test mode is set, and the type of test is specified by an address signal excepting the memory address signals A7 and A8.

However, in an SDRAM, an illegal command may be accidentally generated and the test mode erroneously set in the mode register. For example, when a power supply is turned on, an illegal command may accidentally be generated because the input terminal of the SDRAM is in an indeterminate state. When a test mode is accidentally entered, if the external memory address signals A0 to An cannot be accepted in the test mode, the user immediately becomes aware of an abnormality and can stop use of the memory. For example, in the address counter test mode, the memory address signals A0 to An are input and read data is output. Therefore, the user becomes aware of an abnormality due to the output of the read data. The test mode can then be reset by resetting the mode register.

However, a test may include a test mode which is no different from the normal operation mode. For example, in the high load test mode of a cell plate, the internal voltage is changed to a high voltage, but an address input from an external device, access and the input/output of cell data are performed in the same manner as the normal operation mode. That is, the cell plate high load test corresponds to a burn-in test, and while the counter electrodes of a memory cell are being held at a high voltage, normal operations (write operation and read operation) are performed.

Accordingly, if a high load test mode is accidentally entered, the user may perform the high load test mode without being aware that it is a test mode. Continuous use in this test mode causes a continuous high voltage to be applied to the counter electrodes of a memory cell, thereby shortening the life of the SDRAM.

In recent years, chip size packages (CSP) have been used to increase the device board mounting efficiency. When the CSP is used, a continuity test mode may incorrectly be entered. For example, a grid array type CSP has terminals (solder balls) arranged on one side in a grid pattern. The terminals are connected to fine wiring patterns on the board.

After the device is mounted on the board, a connection test (continuity test) is performed between the terminals of the semiconductor device and the wirings on the board. However, for a CSP, because the terminals are hidden between the CSP and the board, a continuity test cannot be performed by placing a probe against the terminals. Accordingly, the CSP terminals connections to the board wiring are checked by sending a test signal from the wiring on the board to the CSP and then confirming a response from the CSP.

Because the test after a semiconductor device has been mounted differs from the performance and durability tests performed before mounting, it is desirable that the test mode entry method be changed. In the test mode entry before mounting, a test mode is prevented from being incorrectly entered in normal use by using an illegal command comprising many (for example, 15) signal patterns. On the other hand, in the test mode entry after mounting, it is desirable that fewer signals than those for the test mode entry before mounting be used because the non-connected state between terminals and board wiring may exist. Specifically, in the continuity test after mounting, the connection between the terminals of the semiconductor device and the board wirings is checked because there may be a terminal which is not connected to board wiring. Accordingly, if an illegal command is formed by many (for example, 15) signals, there is a possibility that one or more of the terminals to which the signals are input may not be connected to the board wirings. The probability of occurrence of this non-connected state increases as the number of signals of the illegal command increases. Thus, if the illegal command formed by many signals is used, the case where a test mode is not entered occurs more readily. On the other hand, if the number of signals is reduced, the probability of the continuity test mode being accidentally entered in normal use increases.

SUMMARY OF THE INVENTION

An object of the present invention is to provide a semiconductor device which prevents a test mode from being entered incorrectly.

In a first aspect of the present invention, a semiconductor device having a normal operation mode and a test mode is provided. The device includes a decision circuit for determining whether the test mode has been entered. A control circuit changes information related to a normal operation of the semiconductor device when the test mode has been entered.

In a second aspect of the present invention, a semiconductor device having a test mode is provided. The device includes a decision circuit for determining whether the test mode has been entered to output a test mode entry signal. A timer circuit performs a timing operation in response to the test mode entry signal and produces a time-up signal after a predetermined time has elapsed. The decision circuit invalidates the test mode entry signal in response to the time-up signal.

In a third aspect of the present invention, a semiconductor device having a test mode is provided. The device includes a decision circuit for determining whether the test mode has been entered based on a receipt of a plurality set of test mode command signals to output a decision signal.

In a fourth aspect of the present invention, a semiconductor device is provided. The device includes a first operation mode entry circuit for producing a first operation mode signal in response to an external-signal is after a power-on. The first operation mode entry circuit invalidates the first operation mode signal in response to a transition on a logic value of the external signal until a power-off.

In a fifth aspect of the present invention, a semiconductor device is provided. The device includes a first operation mode entry circuit for producing a first operation mode signal in response to a first combination on a logic value of a plurality of external signals after a power-on. The first operation mode entry circuit invalidates the first operation mode signal in response to a transition from the first combination to a second combination o the external signal until a power-off.

In a six aspect of the present invention, a semiconductor device is provided. The device includes a first operation mode recognition circuit for producing a first operation mode signal in response to an external signal. A second operation mode recognition circuit produces a second operation mode signal in accordance with a command signal. A first operation mode decision circuit invalidates the first operation mode signal in response to the second operation mode signal until a power-off.

In a seventh aspect of the present invention, a semiconductor device is provided. The device including a first operation mode recognition circuit for producing a first operation mode signal when a plurality of external signals have the predetermined logic combination. A second operation mode recognition circuit produces a second operation mode signal in accordance with a command signal. A first operation mode decision circuit invalidates the first operation mode signal in response to the second operation mode signal until a power-off.

In a eighth aspect of the present invention, a semiconductor device is provided. The device includes a test mode recognition circuit for detecting a test mode based on an external command and producing a test mode signal. A normal operation mode recognition circuit detects a normal operation mode based on the external command and produces a normal operation mode signal. A test mode decision circuit validates the test mode signal when the normal operation signal is not produced and invalidates the test mode signal when the normal operation mode signal has been produced.

In a ninth aspect of the present invention, a semiconductor device with a function which masks a plurality of I/O data groups including a first I/O data group and a second I/O data group in accordance with a plurality of mask signals including first and second mask signals is provided. The device includes a plurality of data I/O terminal groups including a first data I/O terminal group and a second data I/O terminal group. The semiconductor device masks the second I/O data group corresponding to the second data I/O terminal group in accordance with the second mask signal. A first data compression circuit compresses a first output data group and supplies the compressed first output data group to one terminal of the first data I/O terminal group.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
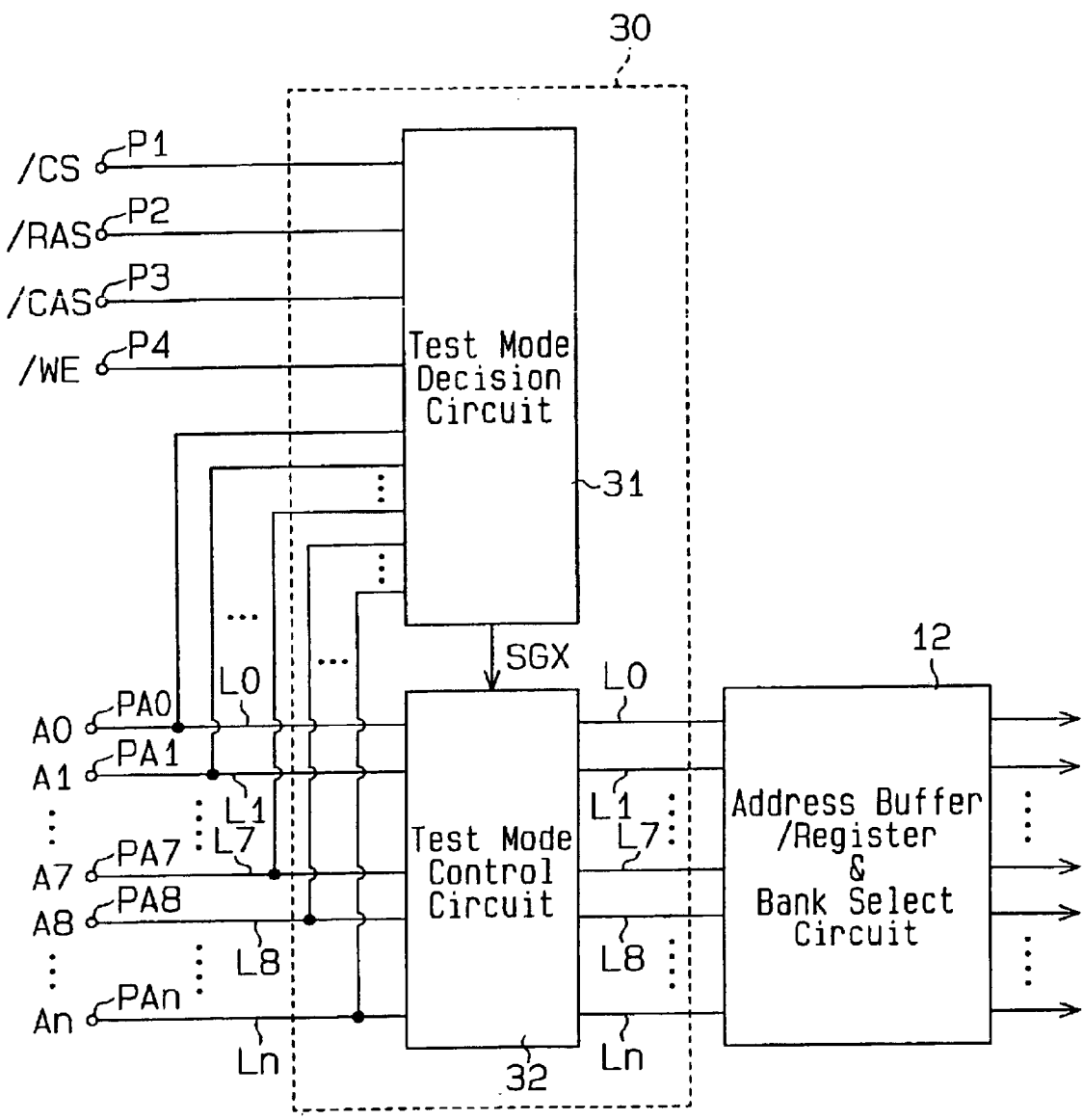
FIG. 1 is a schematic block diagram of a test mode detection circuit according to a first embodiment of the present invention.

In the drawings, like numerals are used for like elements throughout.

First Embodiment

Figure 4:
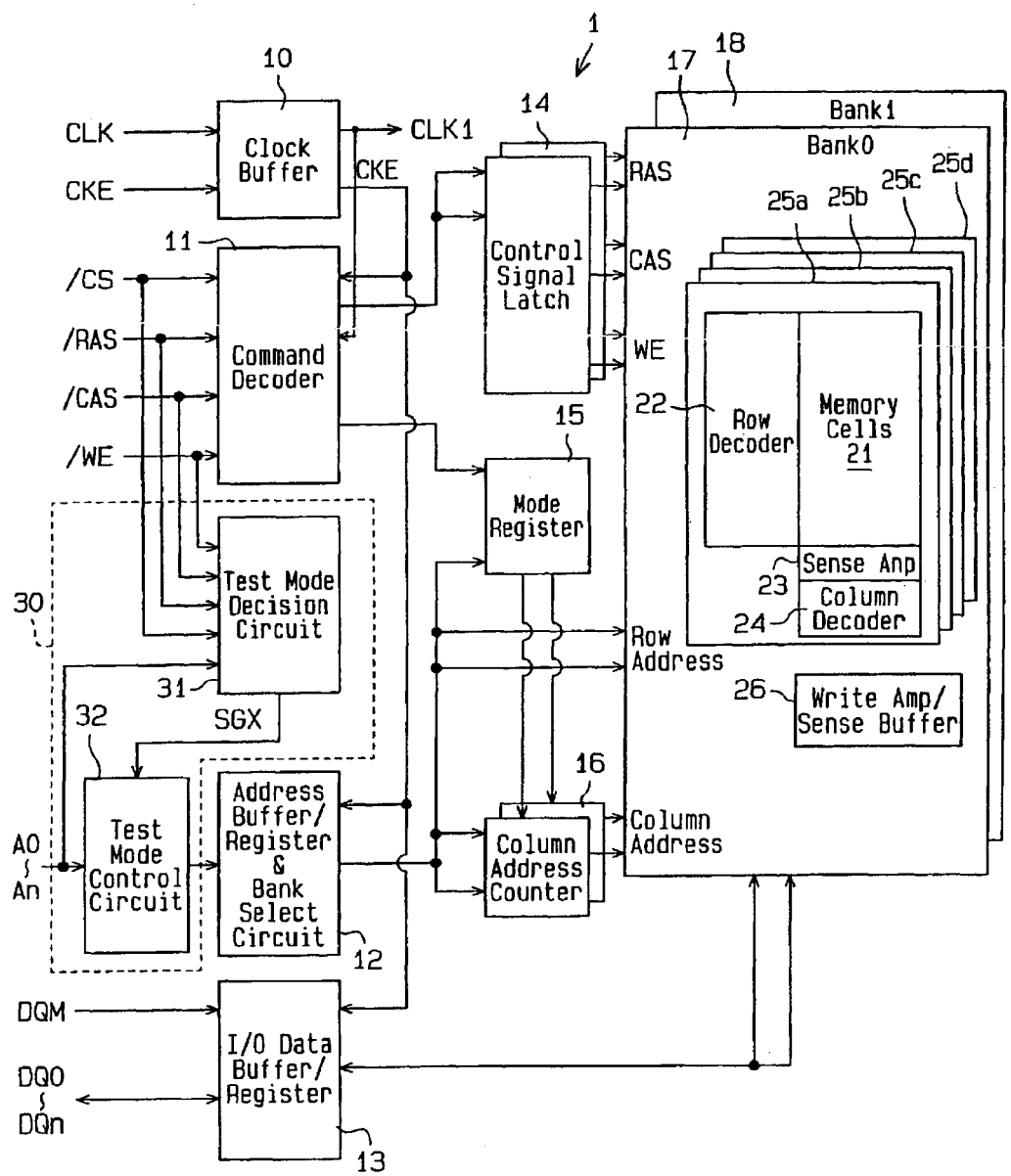
FIG. 4 is a schematic block diagram of an SDRAM according to the first embodiment of the present invention.

FIG. 4 is a schematic block diagram of an SDRAM 1 provided with a test mode function according to a first embodiment of the present invention. The SDRAM 1 comprises a clock buffer 10, a command decoder 11, an address buffer/register & bank selection circuit 12, an I/O data buffer/register 13, a control signal latch circuit 14, a mode register 15, a column address counter 16, a memory circuit 17 for a bank 0, a memory circuit 18 for a bank 1 and a test mode detection circuit 30.

Each of the memory circuits 17, 18 includes a plurality of memory cell blocks (FIG. 4 shows only four memory cell blocks 25a, 25b, 25c and 25d) and a write amp/sense buffer 26. Each memory cell block 25a–25d includes memory cells 21 arranged in a matrix, a row decoder 22, a sense amp 23 and a column decoder 24. That is, in the SDRAM 1, a cell matrix (core circuit) in which the memory cells are arranged in a matrix is provided in a plurality of banks. Each cell matrix is divided into a plurality of the memory cell blocks 25a, 25b, 25c and 25d. Each of the memory cell blocks 25a–25d includes the sense amp 23 provided in column units.

The clock buffer 10 receives a clock signal CLK and a clock enable signal CKE from an external device (not shown) and supplies a synchronous clock signal CLK1 to the SDRAM 1, and also supplies the clock enable signal CKE to the command decoder 11, the address buffer/register & bank selection circuit 12 and the I/O data buffer/register 13.

The command decoder 11 receives an external command including a chip selection signal/CS, a row address strobe signal/RAS, a column address strobe signal/CAS and a write enable signal/WE and produces an internal command. The "/" of each signal/CS, /RAS, /CAS or /WE indicates negative logic. The internal command is supplied to the control signal latch circuit 14 and the mode register 15. The control signal latch circuit 14 latches the internal command and supplies it to the memory circuits 17, 18.

The address buffer/register & bank selection circuit 12 receives memory address signals A0 to An from an external device and supplies the external memory address signals A0 to An to the mode register 15, the column address counter 16, and the memory circuits 17, 18 as internal memory address signals A0 to An (to simplify the description, the signs are the same as the external memory address signals). The address signal An of the highest order bit of the external memory address signals A0 to An is used for the bank selection for selecting the memory circuit 17 or the memory circuit 18. The "n" of the address signal An is set in accordance with the memory capacity.

The I/O data buffer/register 13 receives data signals DQ0 to DQn and a data I/O mask signal DQM from an external device and supplies the data signals DQ0 to DQn to the memory circuits 17, 18. The I/O data buffer/register 13 also receives data signals DQ0 to DQn from the memory circuits 17, 18 and supplies the data signals DQ0 to DQn to an external device. The data I/O mask signal DQM is used for masking the I/O data signals DQ0 to DQn.

The mode register 15 has a first register (not shown) for setting a burst length of a data signal (write and read) in accordance with patterns of the internal memory address signals A0 to An when the internal command from the command decoder 11 is a mode register set command (MRS) and produces burst length information based on the preset burst length. The internal memory address signals A0 to An which determine the burst length have patterns whose use is permitted by the user and do not have illegal patterns whose use is prohibited by the user.

The mode register 15 has a plurality of second registers (not shown) for setting various test modes. The mode register 15 sets a specific test mode when the internal command is a mode register set command and each of the internal memory address signals A0 to An is one of a plurality of the illegal patterns. The illegal patterns, whose use is prohibited by the user, set various test modes.

In the mode register 15, when both the memory address signals A7 and A8 are high, a test mode is entered and the type of test is specified based on other memory address signals. The mode register 15 then outputs a set test mode signal.

The column address counter 16 receives the internal memory address signals A0 to An from the address buffer/register & bank selection circuit 12 and supplies the memory address signals A0–An to the memory circuits 17,18.

Next, the circuit 17 for the bank 0 is described. Because the circuit 18 for the bank 1 has the same configuration as the circuit 17 for the bank 0, its description is omitted.

Each sense amp 23 in the memory cell blocks 25a, 25b, 25c and 25d reads the data of each memory cell 21. For example, the row decoder 22 of the memory cell block 25a produces a word line selection signal in accordance with the internal memory address signals A0 to An. The sense amp 23 is connected to a word line selected by a word line selection signal and receives and holds the data of the memory cell 21 via a bit line. The column decoder 24 produces a column line selection signal for simultaneously selecting the data held in a plurality of sense amps 23.

The write amp/sense buffer 26, in the data read mode, receives parallel data read from the selected memory cell block 25 and supplies the parallel data to the I/O data buffer/register 13 via a data bus as the output data signals DQ0 to DQn. The write amp/sense buffer 26, in the data write mode, receives the parallel input data signals DQ0 to DQn from the I/O data buffer/register 13 and outputs a data signal which can be processed in each memory cell block 25 to a global data bus.

Next, the test mode detection circuit 30 is described. The test mode detection circuit 30 includes a test mode decision circuit 31 and a test mode control circuit 32.

As shown in FIG. 1, the test mode decision circuit 31 is connected to a chip selection (CS) signal input pin P1, a row address strobe (RAS) signal input pin P2, a column address strobe (CAS) signal input pin P3 and a write enable (WE) signal input pin P4. The test mode decision circuit 31 receives the chip selection signal/CS, the row address strobe signal/RAS, the column address strobe signal/CAS and the write enable signal/WE from an external device via the input pins P1 to P4. The test mode decision circuit 31 is connected to address signal input pins PA0 to PAn and receives the address signals A0 to An from an external device.

Figure 2:
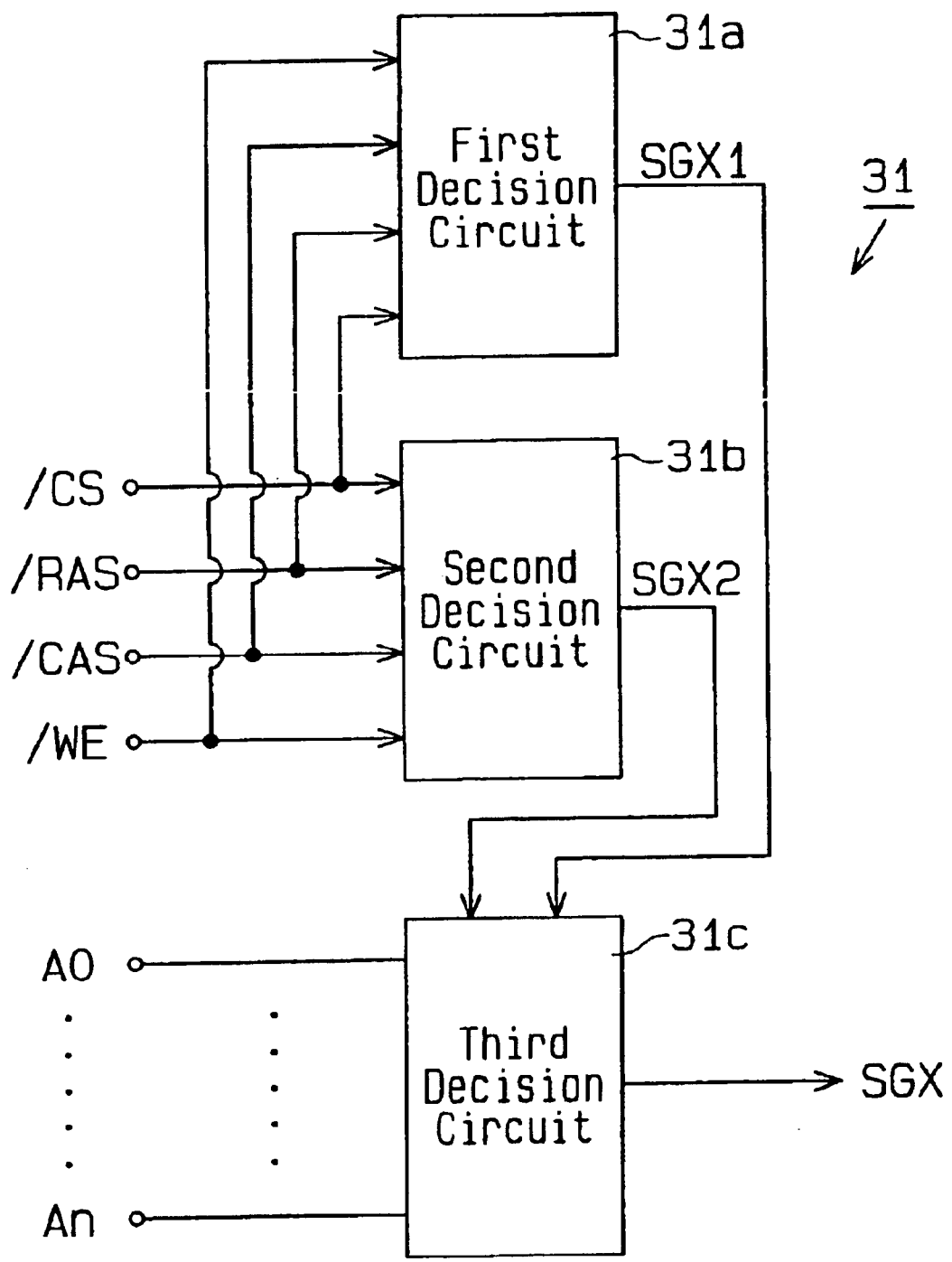
FIG. 2 is a schematic block diagram of a test mode decision circuit of the test mode detection circuit of FIG. 1.

As shown in FIG. 2, the test mode decision circuit 31 includes a first decision circuit 31a, a second decision circuit 31b and a third decision circuit 31c.

Each of the first and second decision circuits 31a and 31b receives an external command including the chip selection signal/CS, the row address strobe signal/RAS, the column address strobe signal/CAS and the write enable signal/WE from an external device. The first decision circuit 31a supplies a first decision signal SGX1 having the H level to the third decision circuit 31c when the external command is a mode register set command. The second decision circuit 31b supplies a second decision signal SGX2 having the H level to the third decision circuit 31c when the external command is a read command.

The third decision circuit 31c receives the external memory address signals A0 to An from an external device in response to the first decision signal SGX1 having the H level and determines whether the patterns of the external memory address signals A0 to An are illegal patterns of a normal operation test mode.

Specifically, the third decision circuit 31c determines a test mode based on the memory address signal A7 and the memory address signal A8, and determines the type of test using other address signals. The test mode decision circuit 31 determines whether the normal operation test mode is set by the other address signal, and if so, a decision signal SGX having the H level indicating entering the normal operation test mode is produced. In other words, if the first decision signal SGX1 having the H level is not output or the first decision signal SGX1 having the H level is output and illegal patterns in the test mode except the test mode in normal operation are obtained, the test mode decision circuit 31 does not produce the decision signal SGX having the H level. For example, if an address counter test is determined based on the patterns of the address signals A0 to An, because the address counter test is not performed in normal operation, the decision signal SGX having the H level is not produced.

On the other hand, if a cell plate high load test is determined, the decision signal SGX having the H level is produced. In the high load test, the only difference from normal operation is that an internal voltage is set at a high voltage, and the operation of the address input, access time, and input and output of cell data is performed in the same manner as that of normal operation. Therefore, the high load test mode is substantially the same as the normal operation mode.

The third decision circuit 31c waits for the input of the second decision signal SGX2 having the H level indicating that the external command introduced synchronously with the internal clock signal CLK1 is a read command latching the decision signal SGX having the H level. The third decision circuit 31c supplies the latched decision signal SGX having the H level to the test mode control circuit 32 when the second decision signal SGX2 having the H level is input. When the decision signal SGX having the H level is not latched, the third decision circuit 31c does not supply the decision signal SGX to the test mode control circuit 32 even if the external command is a read command. The test mode decision circuit 31 outputs the latched decision signal SGX having the H level when a read command is input. Accordingly, at first, when the external command is a mode register set command and the patterns of the address signals A0 to An are in the cell plate high load test mode, the decision signal having the H level is latched. Subsequently, when a read command is input, the latched decision signal SGX having the H level is supplied to the test mode control circuit 32.

The test mode control circuit 32 switches the supply of memory address signals A0 and A1 to two signal lines (in this case, signal lines L0 and L1) among signal lines L0 to Ln which supply the memory address signals A0 to An in accordance with the decision signal SGX. Memory address signals A2 to An are supplied to the address buffer/register & bank selection circuit 12 via signal lines L2 to Ln.

Figure 3:
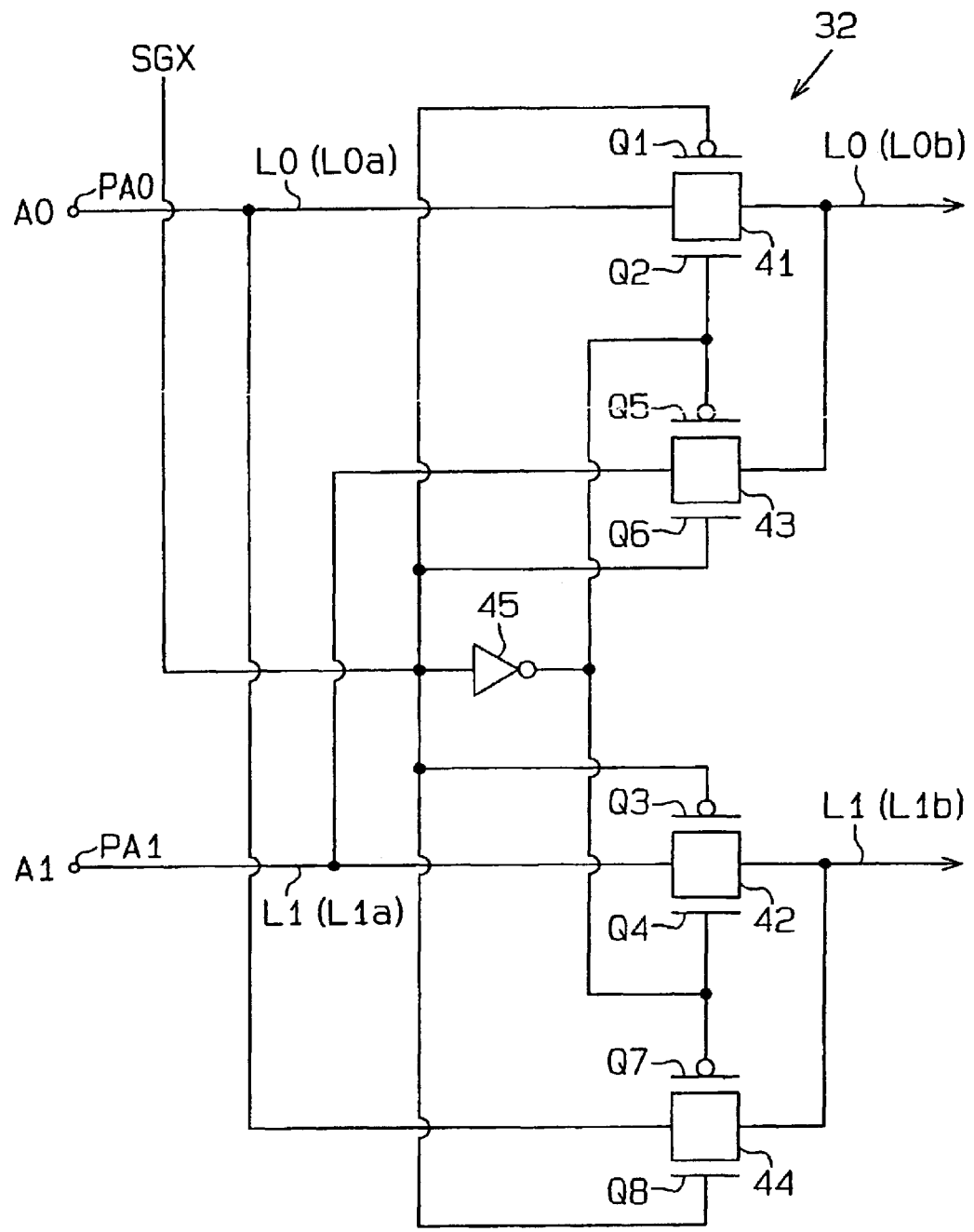
FIG. 3 is a circuit diagram of a test mode control circuit of the test mode detection circuit of FIG. 1.

FIG. 3 is a circuit diagram of the test mode control circuit 32. The test mode control circuit 32 includes four first to fourth transfer gates 41 to 44 and an inverter circuit 45.

The first transfer gate 41 divides the signal line L0 of the memory address signal A0 into a signal line L0a on the side of the input pin PA0 and a signal line L0b on the side of the address buffer/register & bank selection circuit 12. The first transfer gate 41 comprises a PMOS transistor Q1 and an NMOS transistor Q2. The decision signal SGX from the test mode decision circuit 31 is applied to the gate of the PMOS transistor Q1 and the decision signal SGX inverted by the inverter circuit 45 is applied to the gate of the NMOS transistor Q2.

The second transfer gate 42 divides the signal line L1 of the memory address signal A1 into a signal line L1a on the side of the input pin PA1 and a signal line L1b on the side of the address buffer/register & bank selection circuit 12. The second transfer gate 42 comprises a PMOS transistor Q3 and an NMOS transistor Q4. The decision signal SGX is applied to the gate of the PMOS transistor Q3 and the decision signal SGX inverted by the inverter circuit 45 is applied to the gate of the NMOS transistor Q4.

The third transfer gate 43 is connected between the signal line L1a on the pin side and the signal line L0b on the address buffer/resister & bank selection circuit 12 side. The decision signal SGX inverted by the inverter circuit 45 is applied to the gate of a PMOS transistor Q5 of the third transfer gate 43 and the decision signal SGX is applied to the gate of an NHOS transistor Q6.

The fourth transfer gate 44 is connected between the signal line L0a on the pin side and the signal line L1b on the address buffer/register & bank selection circuit 12 side. The decision signal SGX inverted by the inverter circuit 45 is applied to the gate of a PMOS transistor Q7 of the fourth transfer gate 44 and the decision signal SGX is applied to the gate of an NMOS transistor Q8.

When the decision signal SGX having the L level is output from the test mode decision circuit 31, the first and second transfer gates 41 and 42 are turned on and the third and fourth transfer gates 43 and 44 are turned off. As a result, the memory address signal A0 is supplied to the address buffer/register & bank selection circuit 12 via the signal line L0a on the pin side and the signal line L0b on the address buffer/register & bank selection circuit 12 side. The memory address signal A1 is supplied to the address buffer/register & bank selection circuit 12 via the signal line L1a on the pin side and the signal line L1b on the address buffer/register & bank selection circuit 12 side.

When the decision signal SGX having the H level is output from the test mode decision circuit 31, the first and second transfer gates 41 and 42 are turned off and the third and fourth transfer gates 43 and 44 are turned on. As a result, the memory address signal A0 is supplied to the address buffer/register & bank selection circuit 12 via the signal line L0a on the pin side and the signal line L1b on the address buffer/register & bank selection circuit 12 side. The memory address signal A1 is supplied too the address buffer/register & bank selection circuit 12 via the signal line L1a on the pin side and the signal line L0b on the address buffer/register & bank selection circuit 12 side. That is, the supply path between the memory address signal A0 and the memory address signal A1 is switched.

Next, the operation of the test mode detection circuit 30 is described.

Now, when a system power supply is turned on, assume a mode register set command is accidentally generated at the input pins P1 to P4 and an illegal pattern for a test mode is generated at the input pins PA0 to PAn. Then, the SDRAM 1 enters the test mode and the operation which conforms to the test set by the illegal pattern is executed.

At this time, for example, when a cell plate high load test is set, the SDRAM 1 applies a higher voltage than usual between the counter electrodes of the memory cell 21 and waits for the input of a new external command and the memory address signals A0 to An. The test mode decision circuit 31 latches the decision signal SGX having the H level and waits for the input of a read command.

Also in the cell plate high load test, the data read of the memory cell 21 is performed in the same manner as normal operation. Accordingly, the memory address signals A0 to An which specify a read command (external command) are supplied to the SDRAM 1 from an external device.

As soon as a read command is input, the test mode decision circuit 31 supplies the latched decision signal SGX having the H level to the test mode control circuit 32. In response to the decision signal SGX having the H level, the first and second transfer gates 41 and 42 of the test mode control circuit 32 are turned off and the third and fourth transfer gates 43 and 44 are turned on. Then, the memory address signal A0 and the memory address signal A1 are supplied to the address buffer/register & bank selection circuit 12 via the signal line L1 and the signal line L0 respectively. Accordingly, a memory address signal which differs from the memory address signal supplied from an external device is supplied to the address buffer/register & bank selection circuit 12. As a result, data is read from the memory cell 21 which differs from the memory cell 21 specified by the external device. Accordingly, the user is able to recognize that the data si different and that an abnormal operation (operated in the cell plate high load test mode) has been performed. Once the user turns off the system power supply and turns it on again or restarts it, the test mode of the mode register is reset and the SDRAM 1 enters the normal operation mode.

Before the SDRAM 1 is shipped to a customer, if test commands are supplied to the input pins P1 to P4 and PA0 to PAn to perform a test, it is previously known that the address of a memory cell is switched at data read. Accordingly, the test is performed normally by considering the switching of the address.

Next, the characteristics of the SDRAM 1 are described below.

(1) The SDRAM 1 comprises the test mode decision circuit 31 and the test mode detection circuit 30 including the test mode control circuit 32. The test mode decision circuit 31 determines whether a test mode is used in normal operation, and after the test mode has been determined, a decision signal SGX having the H level is produced when a read command is generated. The test mode control circuit 32 switches a set of signal lines in accordance with the decision signal SGX and supplies the address signals A0 and A1 to the address buffer/register & bank selection circuit 12 via a set of the switched signal lines. By switching these signal lines, data is read from the memory cell 21 which differs from the memory address 21 of the address specified by the external device. Accordingly, the user can recognize that the data which differs from expected data has been read and that an abnormal operation (operated in the cell plate high load test mode) has been performed. Once the user turns off a system power supply and turns it on again or restarts it, the high load test mode generated accidentally is reset. Accordingly, a high voltage is not applied continuously to the counter electrodes of the memory cell 21, and so the life of the memory cell 21 is prevented from being shortened.

(2) The test mode decision circuit 31 generates the decision signal SGX when a read command is generated. That is, when the write command is generated, data is written in the memory cell of the specified address. Accordingly, after the data has been written in the memory cell 21, if the written data is read subsequently, the memory cell 21 to which the data is written will not be specified. Accordingly, the difference between the write data and the read data is easily recognized.

Second Embodiment

Figure 5:
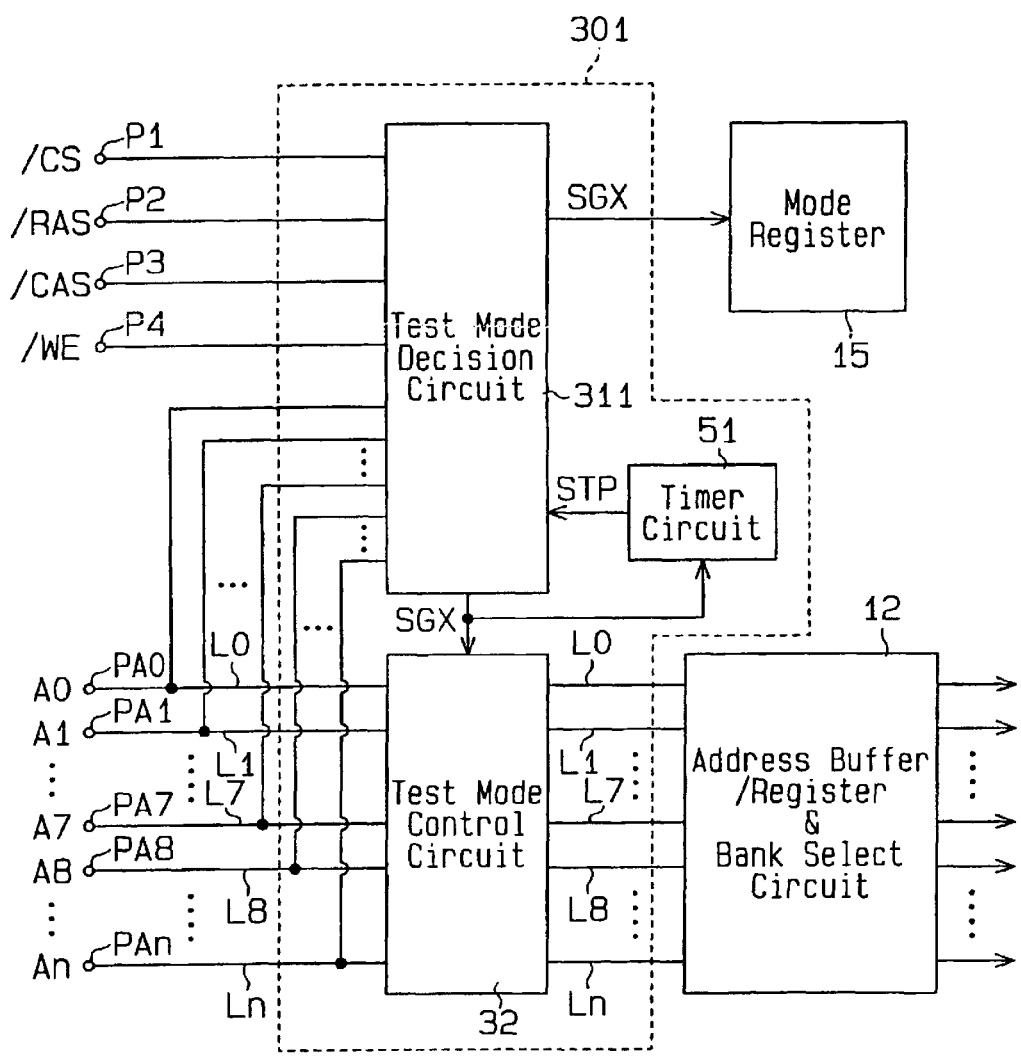
FIG. 5 is a schematic block diagram of a test mode detection circuit according to a second embodiment of the present invention.
Figure 6:
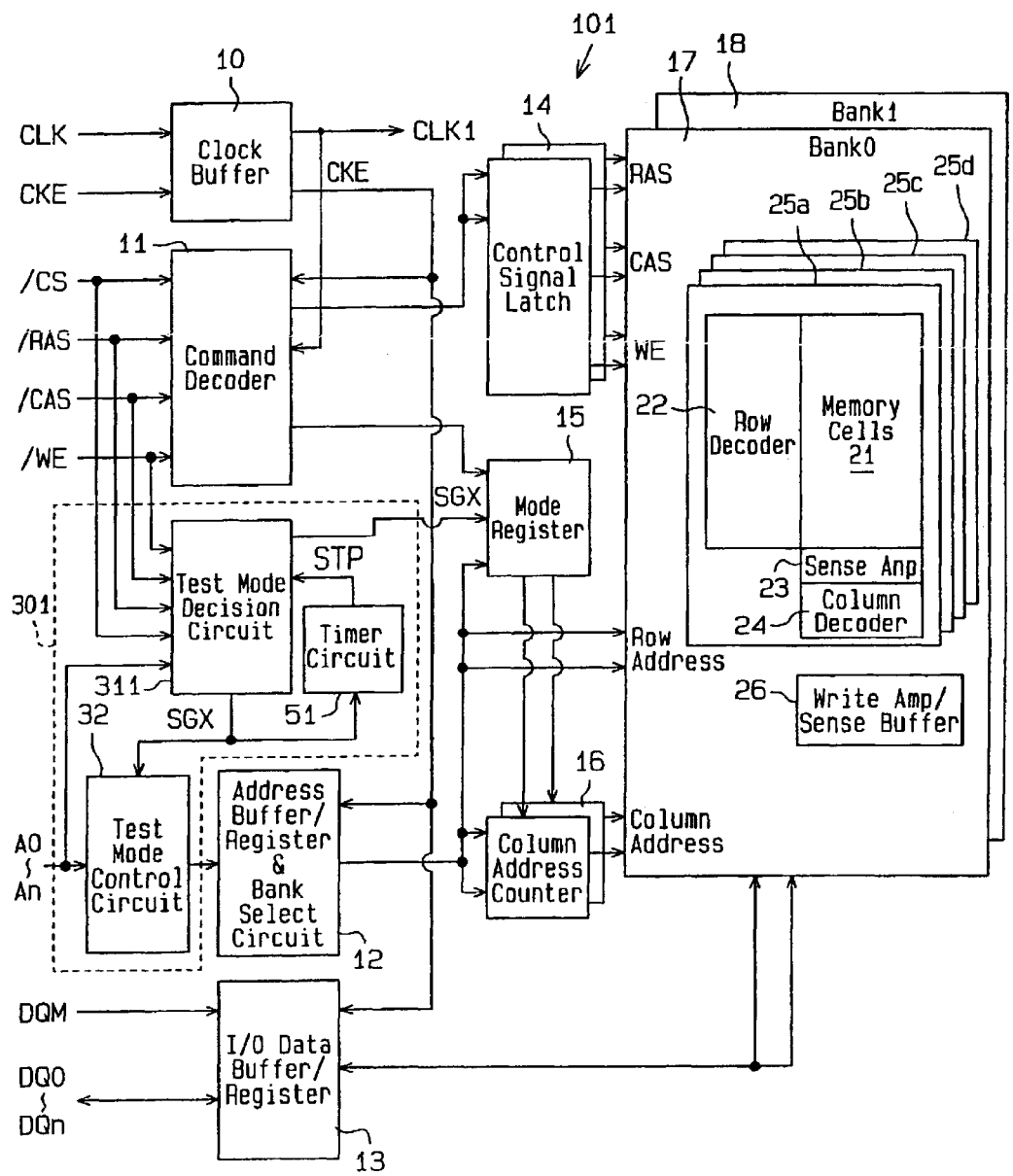
FIG. 6 is a schematic block diagram of an SDRAM according to the second embodiment of the present invention.

FIG. 5 is a schematic block diagram of a test mode detection circuit 301 according to a second embodiment of the present invention and FIG. 6 is a schematic block diagram of the SDRAM 1 provided with the test mode detection circuit 301. In the second embodiment, if a test mode is entered by a command and an address signal generated accidentally, the test mode is reset after a predetermined time has elapsed.

The test mode detection circuit 301 includes a test mode decision circuit 311, the test mode control circuit 32 and a timer circuit 51. The timer circuit 51 supplies a one-pulse time-up signal STP to the test mode decision circuit 311 after the lapse of a predetermined time (for example, one second) after the decision signal SGX having the H level is supplied from the test mode decision circuit 311. The test mode decision circuit 311 deactivates the decision signal SGX in response to the time-up signal STP.

The test mode decision circuit 311 also supplies the decision signal SGX to the mode register 15. The mode register 15 resets the test mode in response to the deactivated decision signal SGX and deactivates the test mode signal.

Figure 7:
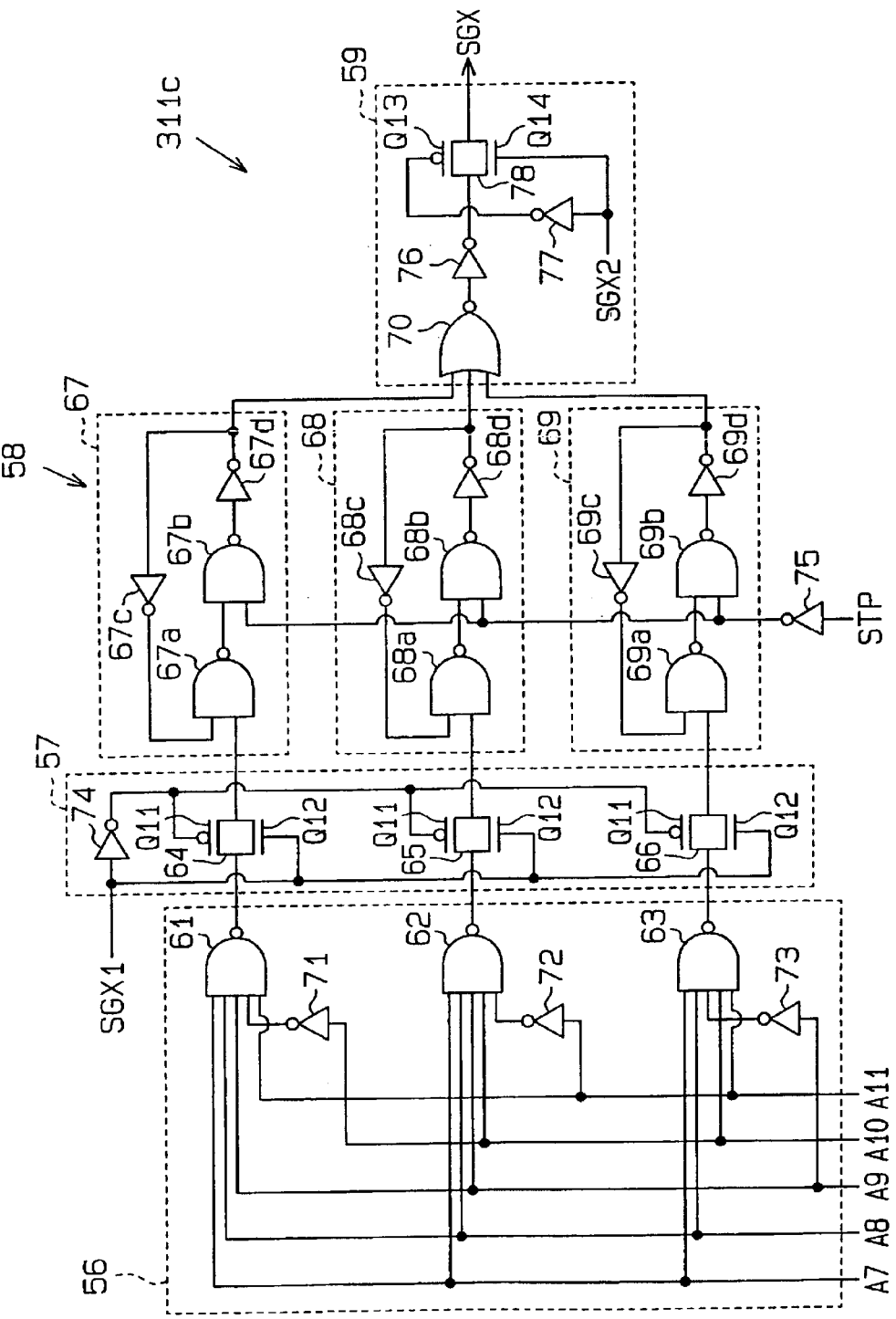
FIG. 7 is a schematic block diagram of a third decision circuit of the test mode decision circuit of FIG. 5.

The test mode decision circuit 311 includes the first decision circuit 31a, the second decision circuit 31b and a third decision circuit 311c (see FIG. 7). The deactivation timing of the second decision signal SGX2 of the second decision circuit 31b differs from that of the first embodiment.

In the second embodiment, assume three types of normal operation tests can be set. In the second embodiment, the test mode in which a test can be executed in one normal operation test mode is determined based on the memory address signals A7 and A8 and it is determined that the normal operation test mode is used based on the memory address signals A9 to A11. The illegal patterns of the three types of normal operation tests are as follows.

The illegal patterns of the first normal operation test include the memory address signal A10 having the L level and the memory address signals A7 to A9 and A11 having the H level. The illegal patterns of the second normal operation test include the memory address signal having the L level and the memory address signals A7 to A10 having the H level. The illegal patterns of the third normal operation test include the memory address signal A9 having the L level and the memory address signals A7, A8, A10 and A11 having the H level.

The third decision circuit unit 311c comprises a decision portion 56, a gate portion 57, a holding portion 58 including three latch circuits 67, 68 and 69 and an output unit 59. As soon as one illegal pattern among the first to third normal operation tests is supplied together with a mode register set command, the latch circuit which corresponds to the normal operation test mode outputs a latch signal having the H level.

Subsequently, as soon as a read command is supplied, the latch signal having the H level is output from the latch circuit as the decision signal SGX. Some time later, as soon as the one-pulse time-up signal STP is supplied from the timer circuit 51, each of the latch circuits 67 to 69 is reset, a latch signal having the L level is output and the decision signal SGX is deactivated.

The decision portion 56 includes three NAND circuits 61 to 63 and three inverter circuits 71 to 73. The first NAND circuit 61 is desirably a five-input NAND circuit. It receives the memory address signals A7 to A9 and A11 and the memory address signal A10 inverted by the inverter circuit 71 and determines whether their signal patterns are the illegal patterns of the first normal operation test. When it is determined that the illegal patterns of the first normal operation test mode are used, the first NAND circuit 61 supplies a first NAND signal having the L level to a first transfer gate 64.

The second NAND circuit 62 is desirably a five-input NAND circuit. It receives the memory address signals A7 to A10 and the memory address signal A11 inverted by the inverter circuit 72 and determines whether their signal patterns are the illegal patterns of the second normal operation test. If the illegal patterns of the second normal operation test are present, the second NAND circuit 62 supplies a second NAND signal having the L level to a second transfer gate 65.

The third NAND circuit 63 is desirably a five-input NAND circuit. It receives the memory address signals A7, A8, A10 and A11 and the memory address signal A9 inverted by the inverter circuit 73 and determines whether their signal patterns are the illegal patterns of the third normal operation test. If the illegal patterns of the third normal operation test are present, the third NAND circuit 63 supplies a third NAND signal having the L level to a third transfer gate 66.

The gate portion 57 includes the three transfer gates 64 to 66 comprising PMOS transistors Q11 and NMOS transistors Q12 and an inverter circuit 74. The first decision signal SGX1 inverted by the inverter circuit 74 is applied to the gate of each of the PMOS transistors Q11. The first decision signal SXG1 from the first decision circuit 31*a* is applied to the gate of each of the NMOS transistors Q12. Accordingly, as soon as a mode register set command is supplied from an external device, the transfer gates 64 to 66 are turned on by the first decision signal SGX1 having the H level output from the first decision circuit 31*a* and the first to third NAND signals are supplied to the three latch circuits 67 to 69 of the holding portion 58.

If a mode register set command is not supplied from an external device, the first to third transfer gates 64 to 66 are turned off by the first decision signal SXG1 having the L level from the first decision circuit 31*a*. As a result, the first to third NAND signals are not supplied to the latch circuits 67 to 69.

The latch circuit 67 includes two NAND circuits 67*a* and 67*b* and two inverter circuits 67*c* and 67*d*. The latch circuit 68 includes two NAND circuits 68*a* and 68*b* and two inverter circuits 68*c* and 68*d*. The latch circuit 69 includes two NAND circuits 69*a* and 69*b* and two inverter circuits 69*c* and 69*d*.

Each of the NAND circuits 67*a* to 69*a* is desirably a two-input NAND circuit. Each has a first input terminal connected to a respective one of the transfer gates 64 to 66 and a second input terminal connected to respective ones of the inverter circuits 67*c* to 69*c*.

Each of the NAND circuits 67*b* to 69*b* is desirably a two-input NAND circuit. Each has a first input terminal connected to the output terminal of a respective one of the NAND circuits 67*a* to 69*a* and a second input terminal (reset input terminal) which receives the one-pulse time-up signal STP inverted by an inverter circuit 75.

Each of the inverter circuits 67*d* to 69*d* is connected to the output terminal of a respective one of the NAND circuits 67*b* to 69*b* and outputs an inverted signal of the output signal of each of the NAND circuits 67*b* to 69*b* as the output signal of each of the latch circuits 67 to 69. The inverter circuits 67*d*–69*d* are also connected to the inverter circuits 67*c*–69*c*.

The reset input terminal of each of the NAND circuits 67*b* to 69*b* is maintained high and a latch output level having the L level is output from each of the latch circuits 67 to 69. In that state, as soon as each NAND signal having the L level is supplied to each of the NAND circuits 67*a* to 69*a*, each of the NAND circuits 67*a* to 69*a* outputs a NAND signal having the H level and each of the NAND circuits 67*b* to 69*b* outputs a NAND signal having the L level. Accordingly, each of the latch circuits 67 to 69 outputs a latch output signal having the H level. Each of the latch circuits 67 to 69 maintains the latch output signal having the H level until the one-pulse time-up signal STP is supplied. That is, as soon as the NAND signal having the L level indicating the normal operation test mode from each of the NAND circuits 61 to 63 is output, each of the latch circuits 67 to 69 outputs the latch signal having the H level. In response to the one-pulse time-up signal STP, each of the latch circuits 67 to 69 outputs the latch signal having the L level.

The output portion 59 includes a NOR circuit 70, two inverter circuits 76 and 77 and a transfer gate 78. The NOR circuit 70 receives the output signals of the latch circuits 67 to 69, and outputs a NOR signal. The NOR signal is output as the decision signal SGX via the inverter circuit 76 and the transfer gate 78.

The transfer gate 78 desirably comprises a PMOS transistor Q13 and an NMOS transistor Q14. The second decision signal SGX2 inverted by the inverter circuit 77 is applied to the PMOS transistor Q13. The second decision signal SGX2 is applied to the gate of the NMOS transistor Q14. As soon as the second decision signal SGX2 having the H level is output from the second decision circuit 31*b*, the transfer gate 78 is turned on and the decision signal SGX is output via the transfer gate 78. If a read command is supplied from the external device, the transfer gate 78 is turned off and the decision signal SGX is output from the output portion 59.

The second decision signal SGX2 of the second decision circuit 31*b* is held until each of the latch circuits 67 to 69 outputs a latch signal having the L level by the one-pulse time-up signal STP. That is, the second decision circuit 31*b* receives the time-up signal STP from the timer circuit 54 and deactivates the second decision signal SGX2 in accordance with the time-up signal STP.

Next, the operation of the test mode detection circuit 301 is described. As soon as a signal which corresponds to a mode register set command is generated accidentally at the input pins P1 to P4 by turning on a system power supply and a signal which corresponds to the illegal pattern of any one of the normal operation tests is generated at the input pins PA7 to PA11, the test mode decision circuit 311 internally latches the decision signal SGX having the H level. The mode register 15 sets the normal operation test mode and outputs a test mode signal which corresponds to the generated illegal pattern. For example, in the cell plate high load test mode, the SDRAM 101 (FIG. 6) applies a high voltage to the counter electrodes of memory cells 21 and normal operation is executed in accordance with each command and address signal.

Subsequently, if a read command is supplied from an external device, the test mode decision circuit 311 supplies the latched decision signal SGX having the H level to the test mode control circuit 32 and the timer circuit 51. The test mode decision circuit 311 supplies the decision signal SGX having the H level, and inhibits the decision signal SGX in response to the time-up signal STP output from the timer circuit 51 after a predetermined time has elapsed. The mode register 15 resets a test mode in response to the stopped supply of the decision signal SGX having the H level and resets the test mode. The SDRAM 101 moves from the test mode to the normal operation mode.

Next, the characteristics of the SDRAM 101 according to the second embodiment are described.

(1) Even if the SDRAM 101 accidentally enters the test mode by a command and an address signal is generated, the test mode is reset in a predetermined time after a read command has been supplied and the SDRAM 101 moves to the normal operation mode. Accordingly, the user becomes aware of an operation error and, for example, the continuation of the cell plate high load test mode, generated accidentally, is prevented without having to turn off and on the system power supply. As a result, shortening of the life of the memory cell 21 is prevented.

(2) The test mode control circuit 32 switches a supply path of an address signal in response to the decision signal SGX having the H level. Accordingly, the user recognizes that read data differs from expected data and that an abnormal operation has been performed.

Third Embodiment

Figure 8:
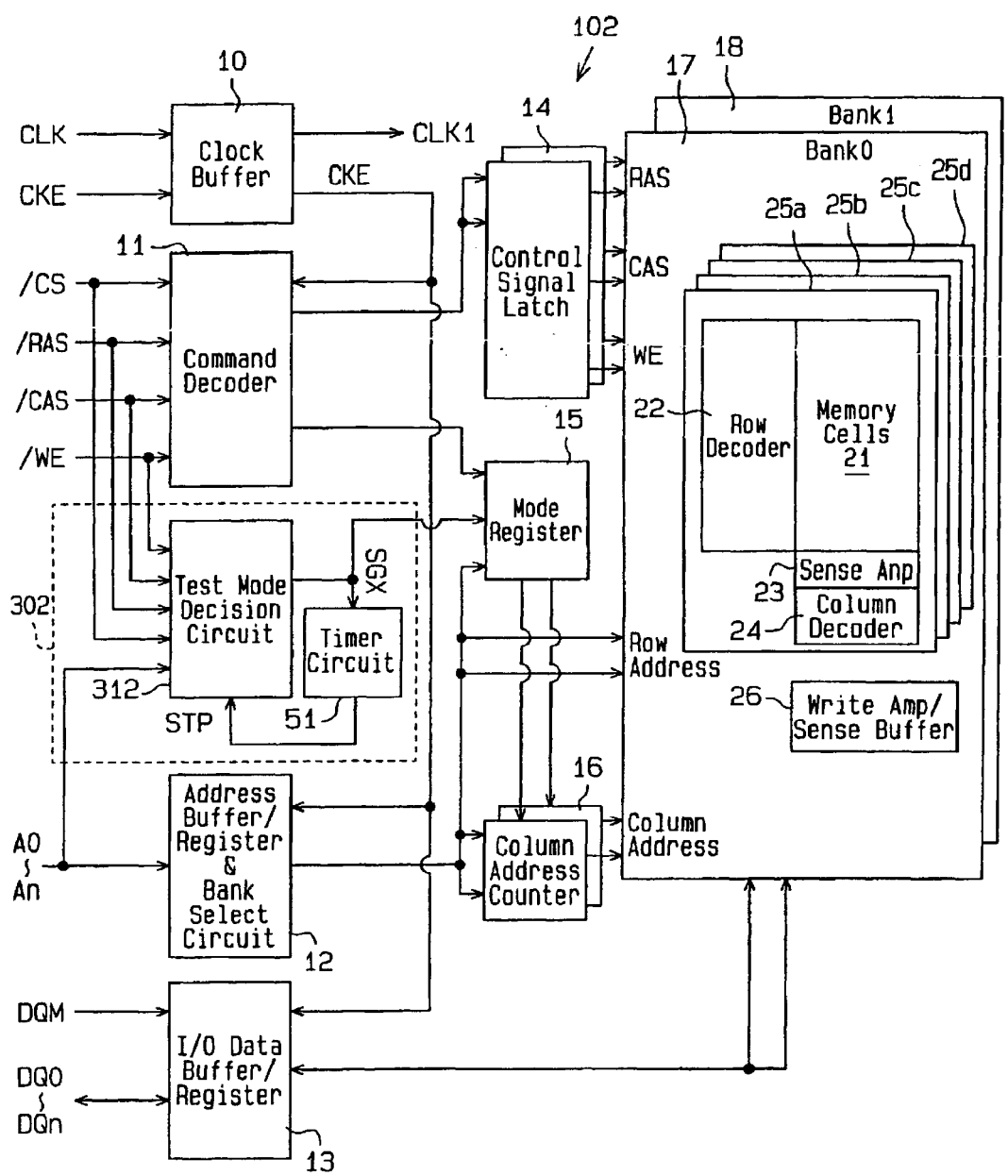
FIG. 8 is a schematic block diagram of an SDRAM according to a third embodiment of the present invention.

FIG. 8 is a schematic block diagram of an SDRAM 102 according to a third embodiment of the present invention. In the third embodiment, even if a mode register set command and an address signal of an illegal pattern are generated accidentally, it is difficult to enter a test mode.

In the third embodiment, in the same manner as the second embodiment, a test mode is intered based on the memory address signals A7 and A8 and any one of the first to third operation test modes is used based on the memory address signals A9 to A11.

A test mode decision circuit 312 receives an external address including the chip selection signal/CS, the row address strobe signal/RAS, the column address strobe signal/CAS and the write enable signal/WE and the external memory address signals A7 to A11.

Figure 9:
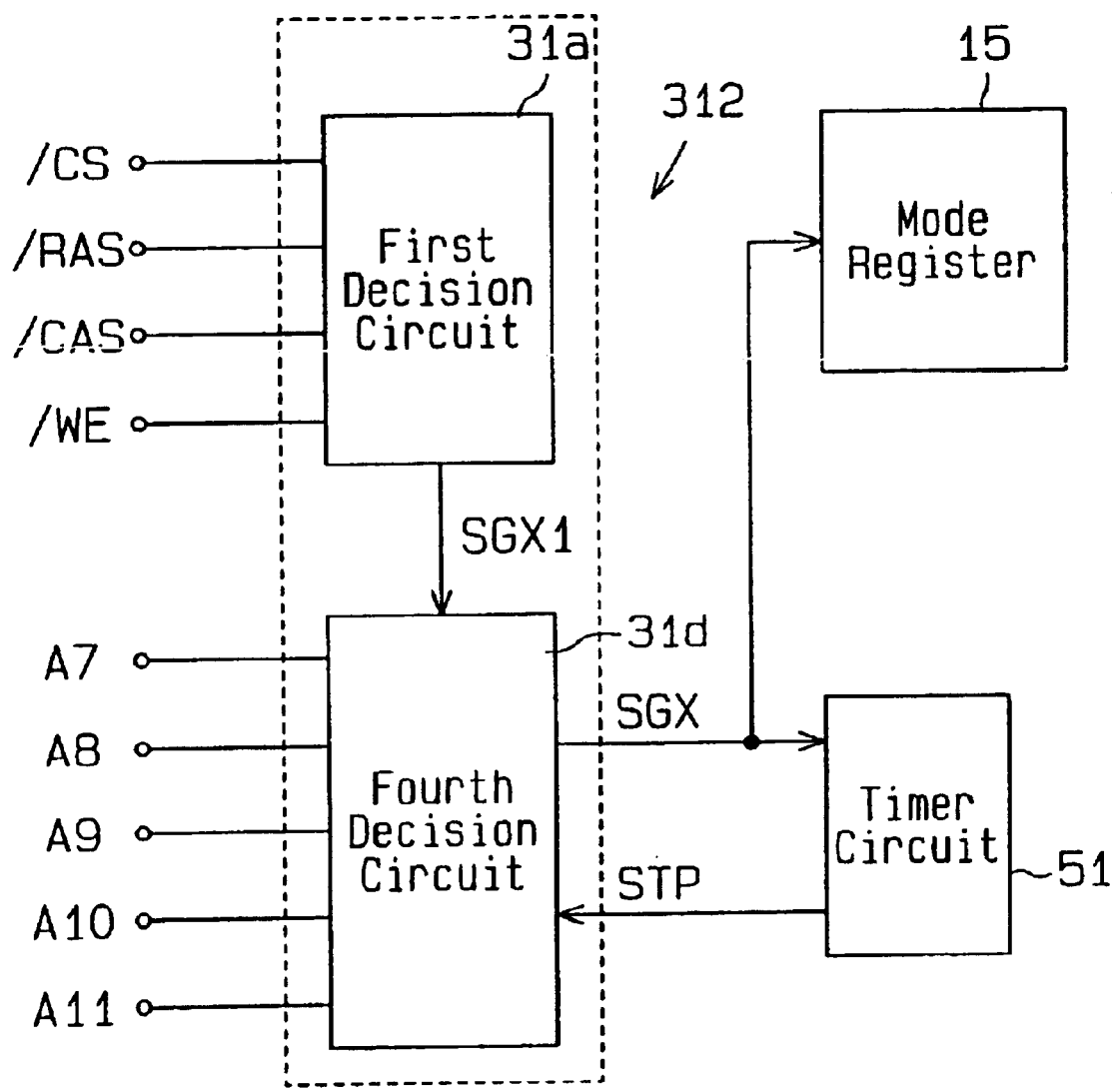
FIG. 9 is a schematic block diagram of an SDRAM test mode decision circuit of the SDRAM of FIG. 8.

The test mode decision circuit 312, as shown in FIG. 9, includes the first decision circuit 31*a* and a fourth decision circuit 31*d*. The first decision circuit 31*a* supplies the first decision signal SXG1 having the H level to the fourth decision circuit 31*d* when an external command is the mode register set command.

The fourth decision circuit 31*d* receives the first decision signal SXG1 and the external memory address signals A7 to A11, and supplies the decision signal SGX having the H level to the mode register 15 and the times circuit 51 when all of the illegal patterns of the first to third normal operation test modes have been generated. That is, in the third embodiment, if all of the illegal patterns of the first to third normal operation test modes are generated accidentally, the SDRAM 102 switches to the test mode. Accordingly, the probability of switching to the test mode is very low.

Figure 10:
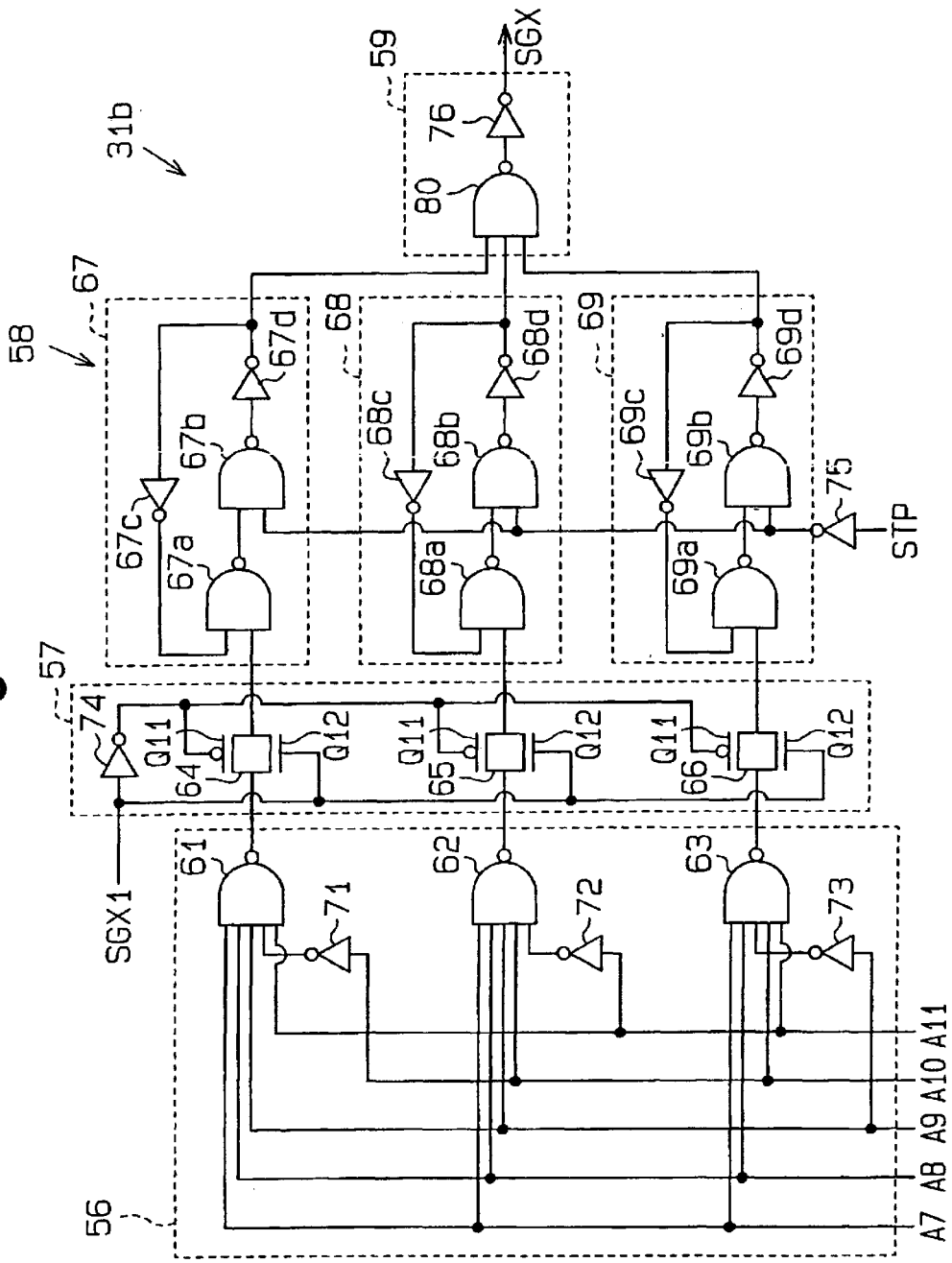
FIG. 10 is a schematic block diagram of a fourth decision circuit of the test mode decision circuit of FIG. 9.

FIG. 10 is a schematic block diagram of the fourth decision circuit 31*d*. The fourth decision circuit 31*d* does not include the inverter circuit 77 and the fourth transfer gate 78 of the third decision circuit 311*c* of FIG. 7 and changes the NOR circuit 70 to a NAND circuit 80.

When the latch signals of the first to third latch circuits 67 to 69 are all high, the NAND circuit 80 outputs a NAND signal having the L level. Then, the decision signal SGX having the H level is supplied from the inverter circuit 76 to the mode register 15 and the timer circuit 51.

When at least one latch signal of the first to third latch circuits 67 to 69 is low, the NAND circuit 80 outputs a NAND signal having the H level. That is, the decision signal SGX having the L level is supplied from the inverter circuit 76 to the mode register 15 and the timer circuit 51.

When all of the first to third NAND circuits 61 to 63 of the decision portion 56 output at least one NAND signal having the L level, the first to third latch circuits 67 to 69 latch a signal having the H level. In other words, when the illegal patterns of the first to third normal operation test modes are supplied to the first to third NAND circuits 61 to 63 respectively, all of the first to third latch circuits 67 to 69 latch the signal having the H level. All of the first to third latch circuits 67 to 69 need to generate the illegal patterns of the first to third normal operation test modes in the input pins PA7 to PA11 at least once to latch the signal having the H level. However, although one of the illegal patterns of the first to third normal operation test modes is accidentally generated, the probability of all of the illegal patterns of the first to third normal operation test modes being generated accidentally is very low. Accordingly, when a power supply is turned on, for example, even if the illegal patterns of the first normal operation test mode are generated accidentally, the NAND circuit 80 outputs the NAND signal having the H level. Therefore, the decision signal SGX having the H level is not output from the inverter circuit 76 and the test mode is not entered.

The timer circuit 51 supplies the one-pulse time-up signal STP to each of the latch circuits 67 to 69 of the fourth decision circuit 31*d* in response to the decision signal SGX having the H level from the fourth decision circuit 31*d* after a predetermined time has elapsed. Accordingly, the fourth decision circuit 31*d* deactivates the decision signal SGX in response to the time-up signal STP.

The mode register 15 sets various test modes in a register based on the mode register command and illegal pattern from the command decoder 11 and the address buffer/register & bank selection circuit 12 when the decision signal SGX having the H level is supplied.

The mode register 15 resets a test mode when the decision signal SGX is deactivated low. Accordingly, even if a normal operation test mode is generated, the mode register 15 resets the normal operation test mode after a predetermined time has elapsed.

Next, the characteristics of the SDRAM 102 according to the third embodiment are described below.

(1) The illegal patterns of the first to third normal operation test modes are detected by the first to third NAND circuits 61 to 63 respectively and the detection result is supplied to the NAND circuit 80 via the first to third latch circuits 67 to 69. The NAND circuit 80 determines whether all the NAND circuits 61 to 63 detect illegal patterns, and if they are detected, and outputs the decision signal SGX having the H level. That is, even if a mode register set command and for example, the illegal patterns for the first normal operation test mode are generated accidentally, the test mode decision circuit 31 supplies the decision signal SGX having the L level to the mode register 15. Accordingly, the mode register 15 does not set the first normal operation test mode and the SDRAM 102 does not switch to the test mode. As a result, for example, the cell plate high load test mode operation generated accidentally is avoided and the life of the memory cell 21 is prevented from being shortened due to the continuous use of high voltage in the test mode.

(2) Even if the SDRAM 102 accidentally performs the normal operation test mode operation, the test mode is entered and the test mode is forcibly reset after a predetermined time has elapsed. Thus, the SDRAM 102 returns to normal operation without user having to turn off and on the system power supply.

Fourth Embodiment

Figure 13:
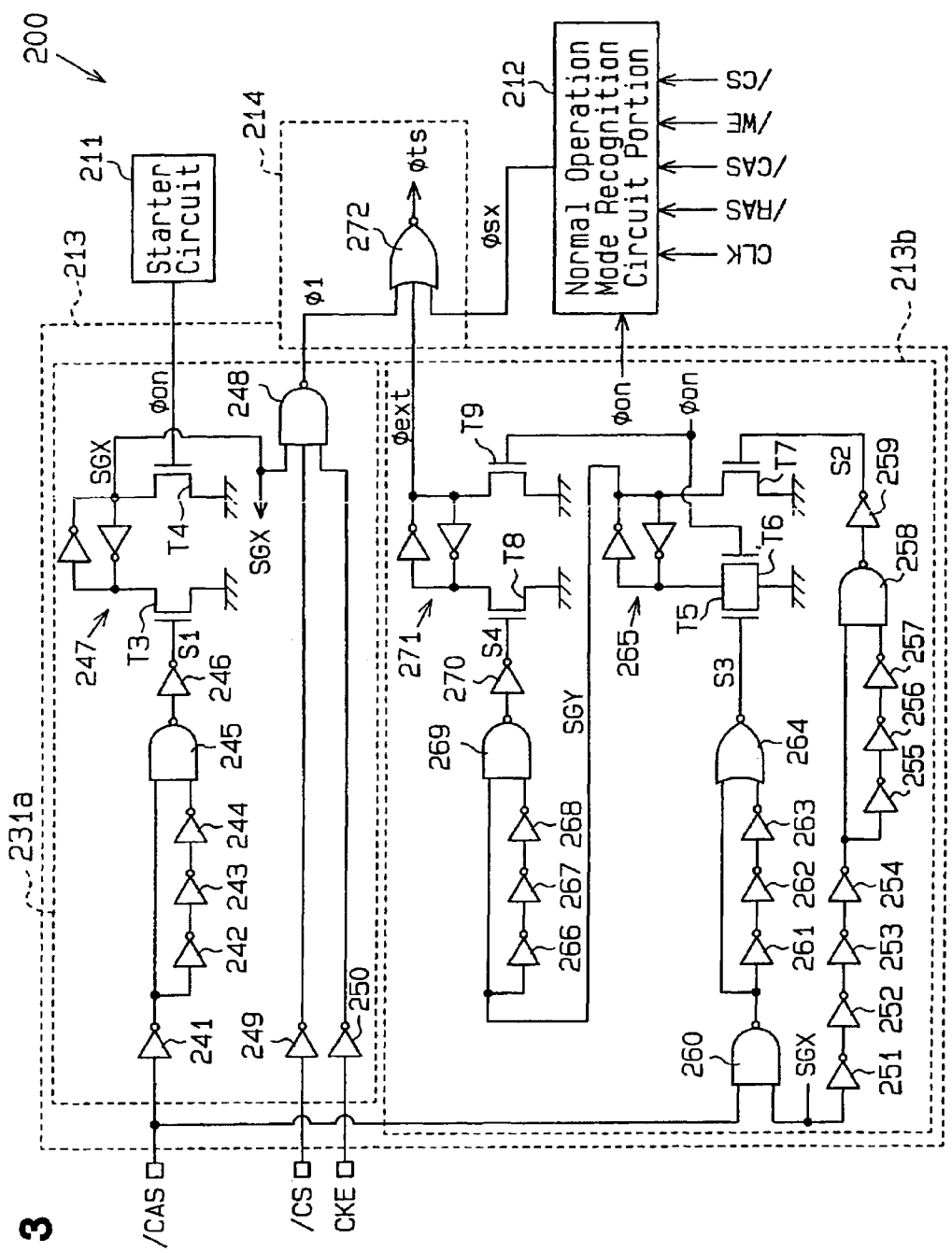
FIG. 13 is a schematic block diagram of a test mode entry circuit according to a fourth embodiment of the present invention.

FIG. 13 is a circuit diagram of an SDRAM test mode entry circuit 200 according to a fourth embodiment of the present invention. The test mode entry circuit 200 comprises a starter circuit 211 serving as a power-on detection circuit, a normal operation mode recognition circuit 212, a test mode recognition circuit 213 and a test mode decision circuit 214.

Figure 15:
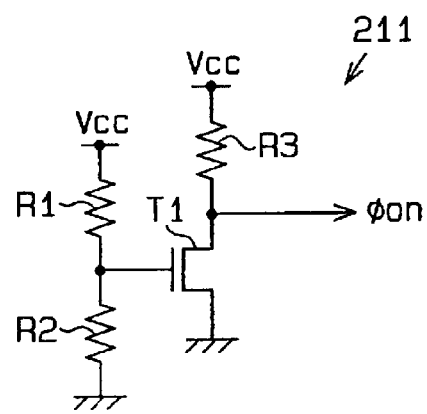
FIG. 15 is a circuit diagram of a starter circuit of the test mode entry circuit of FIG. 13.

The starter circuit 211, as shown in FIG. 15, includes an NMOS transistor T1 and three resistors R1 to R3. The resistors R1 and R2 are connected in series between an external power supply voltage Vcc and a ground voltage to form a voltage dividing circuit. The divided voltage produced by the voltage dividing circuit is supplied to the gate terminal of the NMOS transistor T1. The drain terminal of the NMOS transistor T1 is connected to the external power supply voltage Vcc through the resistor R3 and the source terminal of the NMOS transistor T1 is connected to the ground voltage.

Figure 17:
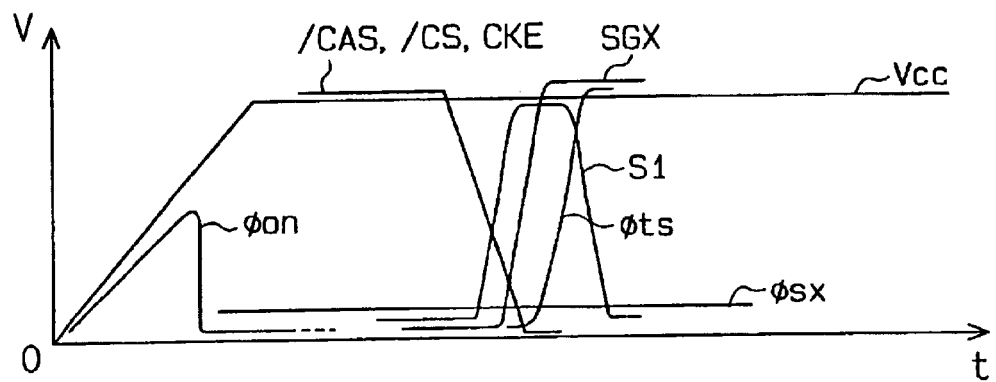
FIG. 17 is an operation waveform chart of when a continuity test mode signal is produced.

As shown in FIG. 17, when the external power supply voltage Vcc is provided from an external device to the SDRAM, the external power supply voltage Vcc rises to a predetermined reference voltage. The divided voltage of the voltage dividing circuit rises in proportion to the external power supply voltage Vcc. When the external power supply voltage Vcc reaches about half of the reference voltage, the NMOS transistor T1 is turned on. After the drain potential of the NMOS transistor T1 has risen to the H level, it falls to the L level and is held low. The drain potential is output from the starter circuit 211 as a power-on signal $\phi$on. That is, when the external power supply voltage Vcc is turned on, the starter circuit 211 supplies the power-on signal $\phi$on, which rises to the H level before the external power supply voltage Vcc reaches the reference voltage and subsequently falls to the L level, to the normal operation mode recognition circuit 212 and the test mode recognition circuit 213.

The normal operation mode recognition circuit 212 receives the chip selection signal/CS, the row address strobe signal/RAS, the column address strobe signal/CAS and the write enable signal/WE from an external device in accordance with the clock signal CLK and determines whether an all bank precharge (PALL) command is specified based on a combination of their signals. The PALL command is a normal command supplied to the SDRAM and precharges all of the memory cell banks. The PALL command is issued before an active command supplied after the power supply is turned on. The active command is issued before a read command and a write command. When the combination of signals defines the PALL command, the normal operation mode recognition circuit 212 outputs a normal operation mode detection signal $\phi$sx having the L level indicating that the PALL command has been received from an external device. If the combination of signals is not the PALL command, the normal operation mode recognition circuit 212 outputs a normal operation mode detection signal $\phi$sx having the L level indicating that the PALL command has not been received.

In the fourth embodiment, when the chip selection signal/CS is low, the row address strobe signal/RAS is low, the column address strobe signal/CAS is high and the write enable signal/WE is low, the PALL command is determined to have been received.

Figure 14:
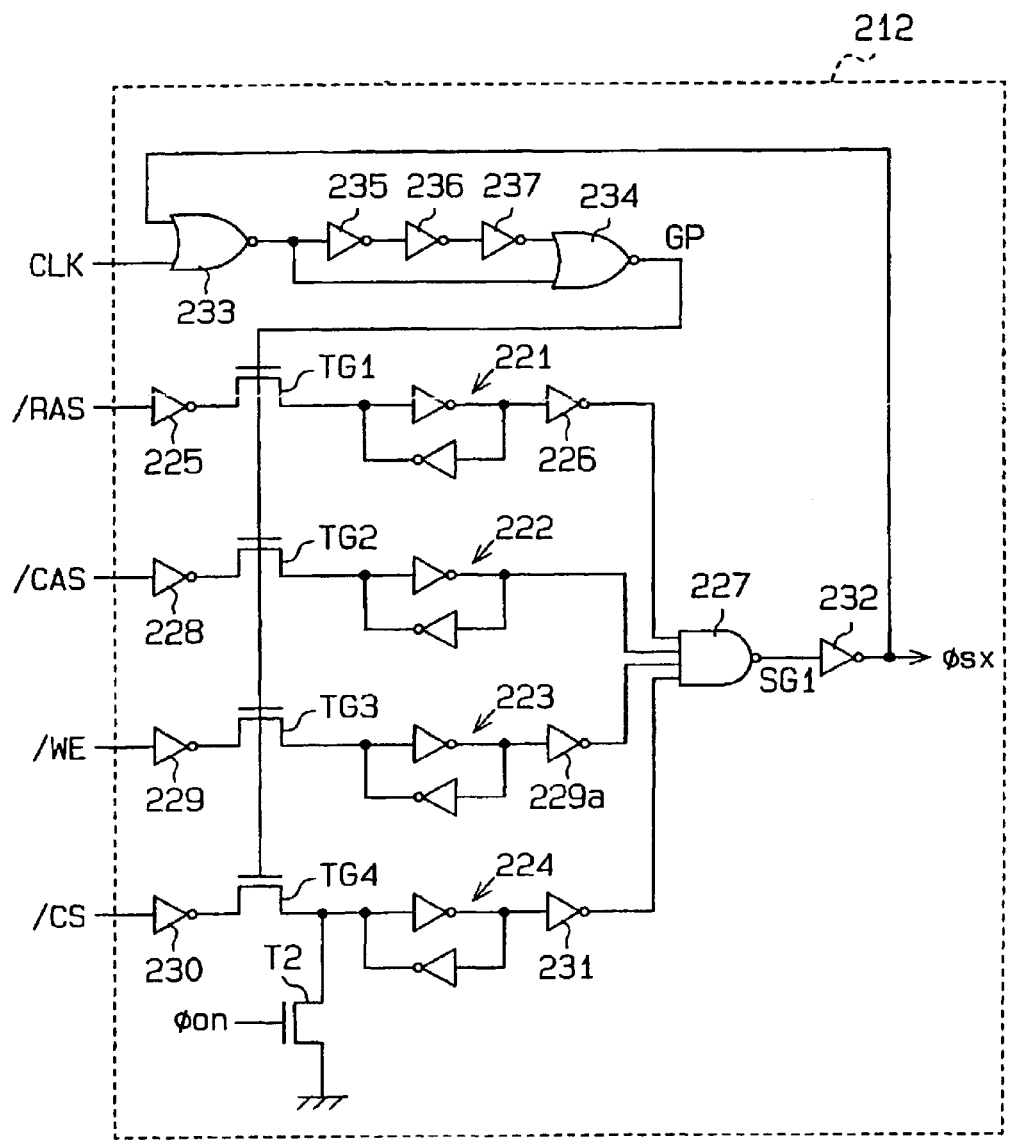
FIG. 14 is a schematic block diagram of a normal operation mode recognition circuit of the test mode entry circuit of FIG. 13.

FIG. 14 is a circuit diagram of the normal operation mode recognition circuit 212. The normal operation mode recognition circuit 212 comprises four latch circuits 221 to 224. The first latch circuit 221 receives the row address strobe signal/RAS via an inverter circuit 225 and a first gate transistor TG1 comprising a NMOS transistor and latches the signal. The latched row address strobe signal/RAS is supplied to a NAND circuit 227 via an inverter circuit 226.

The second latch circuit 222 receives the column address strobe signal/CAS via an inverter circuit 228 and a second gate transistor TG2 comprising a NMOS transistor and latches the signal. The latched column address strobe signal/CAS is supplied to the NAND circuit 227.

The third latch circuit 223 receives the write enable signal/WE via an inverter circuit 229 and a third gate transistor TG3 comprising a NMOS transistor and latches the signal. The latched write enable signal/WE is supplied to the NAND circuit 227 via the inverter circuit 229a.

The fourth latch circuit 224 receives the chip selection signal/CS via an inverter circuit 230 and a fourth transistor TG4 comprising a NMOS transistor and latches the signal. The latched chip selection signal/CS is supplied to the NAND circuit 227 via the inverter circuit 231.

The NAND circuit 227 outputs a NAND signal having the L level when an inverted signal of the row address strobe signal/RAS, the column address strobe signal/CAS, the write enable signal/WE and an inverted signal of the chip selection signal/CS are low. That is, when the row address strobe signal/RAS, the write enable signal/WE and the chip selection signal/CS are low and the column address strobe signal/CAS is high (that is, when the PALL command is detected), the NAND circuit 227 outputs a NAND signal SG1 having the L level. When at least one of signals is low, the NAND circuit 227 outputs a NAND signal SG1 having the H level.

The NAND signal SG1 is inverted by an inverter circuit 232 and is output as the normal operation mode detection signal $\phi$sx. Accordingly, when the PALL command is supplied from an external device, the normal operation mode detection signal $\phi$sx having the H level is output, and when a command other than the PALL command is supplied from an external device, the normal operation mode detection signal $\phi$sx having the L level is output.

A NOR circuit 233 receives the normal operation mode detection signal $\phi$sx and the clock signal CLK, and produces an inverted clock signal/CLK when the normal operation mode detection signal $\phi$sx is low. The inverted clock signal/CLK is supplied to the first input terminal of a NOR circuit 234 and is supplied to the second input terminal of the NOR circuit 234 via three inverter circuits 235 to 237. Accordingly, whenever the clock signal CLK rises to the H level, the NOR circuit 234 applies a gate pulse signal GP having a pulse width defined by the delay times of the three inverter circuits 235 to 237 to the gate terminals of the first to fourth gate transistors TG1 to TG4.

The first to fourth gate transistors TG1 to TG4 pass the chip selection signal/CS, the row address strobe signal/RAS, the column address strobe signal/CAS and the write enable signal/WE in response to the gate pulse signal GP respectively and these passed signals are latched by the first to fourth latch circuits 221 to 224.

When the normal operation mode detection signal φsx is high, the NOR circuit 233 outputs a signal having the H level instead of the clock signal CLK. Accordingly, the NOR circuit 234 does not output the gate pulse signal GP.

While an external command other than the PALL command is being supplied, the normal operation mode recognition circuit 212 receives the external command whenever the gate pulse signal GP rises. Then, when the PALL command is supplied, the normal operation mode recognition circuit 212 produces the normal operation mode detection signal φsx having the H level and does not receive the external command after the PALL command. In other words, the normal operation mode recognition circuit 212 continues the decision operation until the PALL command is supplied, and when the PALL command is supplied, the normal operation mode recognition circuit 212 continuously outputs the normal operation mode detection signal φsx having the H level and completes the decision operation.

The node between the fourth gate transistor TG4 and the fourth latch circuit 224 is connected to a ground voltage via an NMOS transistor T2. The power-on signal φon from the starter circuit 211 is supplied to the gate of the NMOS transistor T2. The NMOS transistor T2 is instantaneously turned on in response to the power-on signal φon. At this time, the fourth latch circuit 224 latches a signal having the L level and a signal having the L level is output from an inverter circuit 231. That is, when the external power supply voltage Vcc is turned on, the fourth latch circuit 224 is set in the initial state so that a signal having the same combination as the PALL, command cannot be latched accidentally.

As shown in FIG. 13, the test mode recognition circuit 213 receives the chip selection signal/CS, the column address strobe signal/CAS and the clock enable signal CKE from an external device and detects a continuity test mode based on these signals. In the fourth embodiment, when all of the chip selection signal/CS, the column address strobe signal/CAS and the clock enable signal CKE are low, the entry of the continuity test mode is detected.

The test mode recognition circuit 213 includes a first decision circuit 213a which produces a test mode detection signal (test mode start signal) φ1 by determining an external command and a second decision circuit 213b which produces a continuity test end signal φext by determining the external command.

First, the first decision circuit 213a is described.

The column address strobe signal/CAS is supplied to the first input terminal of a NAND circuit 245 via four inverter circuits 241 to 244 and is supplied to the second input terminal of the NAND circuit 245 via the inverter circuit 241. An inverter circuit 246 is connected to the output terminal of the NAND circuit 245. When the column address strobe signal/CAS falls to the L level, a one-shot pulse signal S1 maintained high is supplied to the gate of an NMOS transistor T3 from the inverter circuit 246 during the delay time determined by the three inverter circuits 242 to 244. Accordingly, when the column address strobe signal/CAS falls, the NMOS transistor T3 is turned on to the extent of the delay time of the three inverter circuits 242 to 244 in response to the one-shot pulse signal S1.

The NMOS transistor T3 is connected to a latch circuit 247. Then, when the column address strobe signal/CAS falls and the NMOS transistor T3 is turned on, the latch circuit 247 outputs a latch signal having the H level as the detection signal SGX. The detection signal SGX having the H level is held even if the one-shot pulse signal S1 is produced subsequently.

The output terminal of the latch circuit 247 is connected to a ground voltage via an NMOS transistor T4. The power-on signal φon from the starter circuit 211 is applied to the gate terminal of the NMOS transistor T4. In response to the power-on signal φon, the NMOS transistor T4 is instantaneously turned on and the latch circuit 247 outputs a latch signal having the L level. Accordingly, when the external power supply voltage Vcc is turned on, the latch circuit 247 is set in the initial state.

A NAND circuit 248 receives a detection signal SG from the latch circuit 247, the chip selection signal/CS inverted by an inverter circuit 249 and the clock enable signal CKE inverted by an inverter circuit 250, and supplies a NAND signal having the L level to a NOR circuit 272 as a test mode detection signal φ1 when the detection signal SGX is high, the chip selection signal/CS is low and the clock enable signal CKE is low.

The detection signal SGX of the latch circuit 247 is supplied to the first input terminal of a NAND circuit 258 via seven inverter circuits 251 to 257 and is supplied to the second input terminal of the NAND circuit 258 via the four inverter circuits 251 to 254. An inverter circuit 259 is connected to the output terminal of the NAND circuit 258. When the detection signal SGX falls to the L level, a one-shot pulse signal S2 maintained high is output from the inverter circuit 259 during the delay time determined by the three inverter circuits 255 to 257.

Next, the second decision circuit 213b is described.

The detection signal SGX of the latch circuit 247 is also supplied to the first input terminal of a NAND circuit 260. The column address strobe signal/CAS is supplied to the second input terminal of the NAND circuit 260. When the signals SGX and/CAS are high, the NAND circuit 260 outputs a NAND signal having the L level. That is, after the detection signal SGX having the H level has been output from the latch circuit 247, when the column address strobe signal/CAS rises, the signal of the NAND circuit 260 falls.

The signal of the NAND circuit 260 is supplied to the first input terminal of a NOR circuit 264 and is supplied to the second input terminal of the NOR circuit 264 via three inverter circuits 261 to 263. When the signal of the NAND circuit 260 falls, the NOR circuit 264 outputs a one-shot pulse signal S3 held high during the delay time determined by the three inverter circuits 261 to 263. The one-shot pulse signal S3 is supplied to the gate terminal of an NMOS transistor T5 and the NMOS transistor T5 is connected to the input terminal of a latch circuit 265. When the NMOS transistor T5 is turned on in response to the one-shot pulse signal S3, the latch circuit 265 outputs a latch signal SGY having the H level. An NMOS transistor T6 in which the power-on signal φon is supplied to the gate is connected to the input terminal of the latch circuit 265. Accordingly, when the NMOS transistor T6 is turned on in response to the power-on signal φon, the latch circuit 265 outputs the latch signal SGY having the H level.

The output terminal of the latch circuit 265 is connected to an NMOS transistor T7 in which the one-pulse shot pulse S2 is supplied to its gate. When the NMOS transistor T7 is turned on in response to the one-shot pulse signal S2, the latch circuit 265 outputs the latch signal SGY having the L level. That is, the latch signal SGY of the latch circuit 265 is set high by the power-on signal φon and is set low by the one-shot pulse signal S2 supplied subsequently, and then is set high by the one-shot pulse signal S3 supplied after the one-shot pulse signal S2.

The latch signal SGY of the latch circuit 265 is supplied to the first input terminal of the NAND circuit 269 and to the second input terminal of the NAND circuit 269 via three inverter circuits 266 to 268. An inverter circuit 270 is connected to the output terminal of the NAND circuit 269. When the latch signal SGY is issued, a one-shot pulse signal S4 maintained high is output from the inverter circuit 270 during the delay time determined by the three inverter circuits 266 to 268.

The one-shot pulse signal S4 is supplied to the gate terminal of an NMOS transistor T8 and the NMOS transistor T8 is connected to the input terminal of a latch circuit 271. When the NMOS transistor T8 is turned on in response to the one-shot pulse signal S4, the latch circuit 271 outputs a latch signal having the H level. An NMOS transistor T9 in which the power-on signal φon is supplied to its gate is connected to the output terminal of the latch circuit 271. When the NMOS transistor T9 is turned on in response to the power-on signal φon, the latch circuit 271 is set in the initial state and outputs a latch signal having the L level. That is, the latch signal of the latch circuit 271 is set low by the power-on signal φon and is set high in response to the one-shot pulse signal S4 supplied subsequently. The latch signal having the H level of the latch circuit 271 is supplied to a NOR circuit 272 as the continuity test end signal φext. That is, after the detection signal SGX having the H level has been output at the trailing edge of the column address strobe signal/CAS, if the column address strobe signal/CAS rises, the continuity test end signal φext having the H level is supplied to the NOR circuit 272. The continuity test end signal next having the H level is maintained until the power-on signal φon is re-input.

The test mode decision circuit 214 includes the NOR circuit 272. The NOR circuit 272 receives the test mode detection signal φ1, the continuity test end signal next and the normal operation mode detection signal φsx and outputs a test mode signal φts having the H level when all the signals φ1, φext and φsx are low. When at least one of the signals φ1, next and φsx is high, the NOR circuit 272 outputs the test mode signal φts having the L level. When the test mode signal φts is high, the SDRAM 103 enters the continuity test mode.

Accordingly, as shown in FIG. 17, when the column address strobe signal/CAS, the chip selection signal/CS and the clock enable signal CKE fall to the L level before the normal operation mode recognition circuit 212 detects the PALL command after the external power supply voltage Vcc has been turned on, the NOR circuit 272 outputs the test mode signal φts having the H level.

Subsequently, when the continuity test end signal φext rises to the H level, the NOR circuit 272 outputs the test mode signal φts having the L level. The continuity test end signal φext having the H level is produced because the column address strobe signal/CAS rises to the H level when a continuity test is completed. Moreover, once the continuity test end signal φext has been set high, it is maintained high so long as the power-on signal φon is not supplied. Accordingly, the SDRAM does not enter the continuity test mode until the external power supply voltage Vcc has been turned off.

When the normal operation mode detection signal φsx rises to the H level, the NOR circuit 272 outputs the test mode signal φts having the L level and the continuity test is completed. Moreover, because the normal operation mode detection signal φsx having the H level is maintained high until the power-on signal φon is supplied, the SDRAM does not enter the continuity test mode until the external power supply voltage Vcc is turned off.

Figure 18:
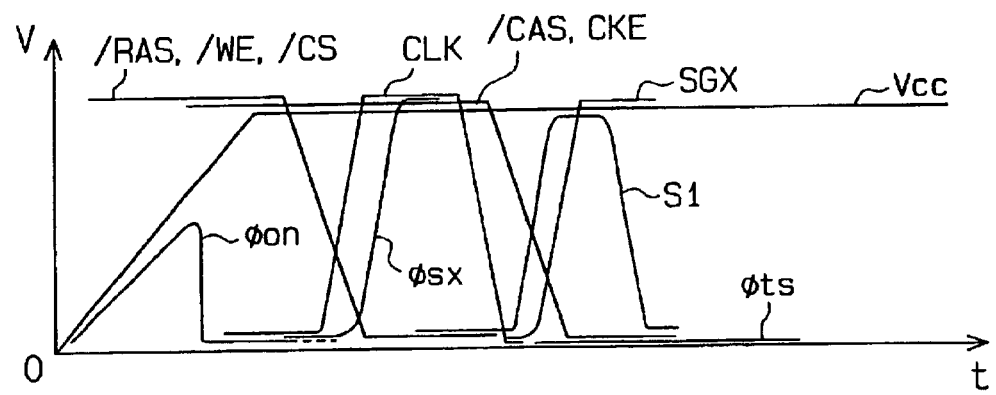
FIG. 18 is an operation waveform chart of when a continuity test mode signal is not produced.

On the other hand, as shown in FIG. 18, when the normal operation mode recognition circuit 212 detects the PALL command before the column address strobe signal/CAS, the chip selection signal/CS and the clock enable signal CKE fall to the L level after the external power supply voltage Vcc has been turned on, the test mode signal φts is maintained low. That is, when the normal operation mode detection signal φsx having the H level is output before the test mode signal φts is set high, the test mode signal φts is maintained low and the (test) continuity mode is not entered.

Figure 16:
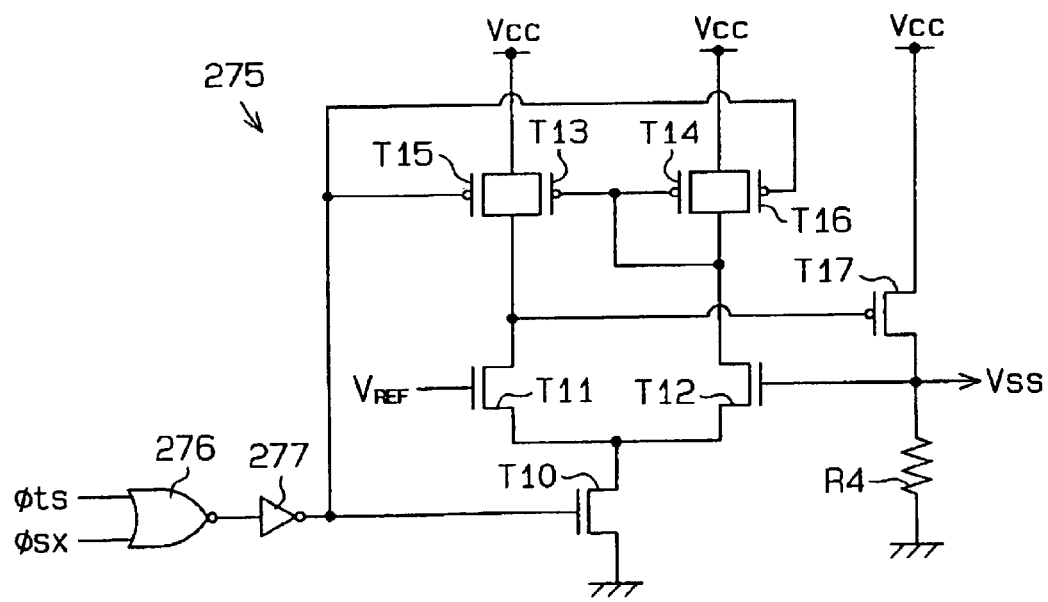
FIG. 16 is a circuit diagram of an active power supply generation circuit in accordance with the present invention.

The test mode signal φts is supplied to each internal circuit (not shown) of the DSRAM for executing the continuity test. FIG. 16 is a circuit diagram of the SDRAM internal circuits, an active power supply generation circuit 275, which produces an active power supply voltage Vss from the external power supply voltage Vcc. The active power supply generation circuit 275 supplies an operating power supply voltage Vss to each of the other internal circuits of the SDRAM in the normal operation mode.

The active power supply generation circuit 275 comprises a NOR circuit 276 and an inverter circuit 277 connected to the output terminal of the NOR circuit 276. The test mode signal φts from the NOR circuit 272 and the normal operation mode detection signal φsx from the normal operation mode recognition circuit 212 are supplied to the NOR circuit 276. When both the test mode signal φts and the normal operation mode detection signal φsx are low, a signal having the L level is output from the inverter circuit 277. When either the test mode signal φts or the normal operation mode detection signal φsx is high, a signal having the H level is output from the inverter circuit 277.

The output signal of the inverter circuit 277 is supplied to the gate of an NMOS transistor T10. The drain of the NMOS transistor T10 is connected to the source terminals of NMOS transistors T11 and T12 which form a differential amplification circuit. The drain terminals of the NMOS transistors T11 and T12 are connected to the external power supply voltage Vcc via PMOS transistors T13 and T14 which form a current mirror circuit. PMOS transistors T15 and T16 are connected to the PMOS transistors T13 and T14 in parallel respectively. The gate terminals of the PMOS transistors T15 and T16 are connected to the output terminal of the inverter circuit 277.

A predetermined reference voltage Vref is applied to the gate terminal of the NMOS transistor T11. The drain terminal of the NMOS transistor T11 is connected to the gate terminal of a PMOS transistor T17 as an output unit. The drain terminal of the PMOS transistor T17 is connected to the external power supply voltage Vcc. The drain terminal of the PMOS transistor T17 is connected to the gate terminal of the NMOS transistor T12 and is connected to a ground voltage via a resistor R4.

When the NMOS transistor T10 is turned on by the signal having the H level from the inverter circuit 277, the NMOS transistors T11 and T12 operate and the voltage determined by the voltage dividing ratio between the on-resistance and the resistor R4 of the PMOS transistor T17 is supplied to each internal circuit as the active power supply voltage Vss. The active power supply voltage Vss is supplied to the gate terminal of the NMOS transistor T12 and differential amplification operation is performed using the reference voltage Vref. The PMOS transistor T17 is controlled so that the active power supply voltage Vss can obtain the same value as the reference voltage Vref.

The active power supply generation circuit 275 supplies the active power supply voltage Vss to each internal circuit when the normal operation mode detection signal φsx is set high due to the generation of the PALL command. The active power supply generation circuit 275 supplies the active power supply voltage Vss to each internal circuit to perform a continuity test when the test mode signal φts is set high. That is, even if the continuity test mode is entered, the active power supply generation circuit 275 produces the active power supply voltage Vss.

Next, the characteristics of an SDRAM according to the fourth embodiment are described below.

(1) The test mode recognition circuit 213 of the test mode entry circuit 200 detects a continuity test mode using the three signals, namely the column address strobe signal/CAS, the chip selection signal/CS and the clock enable signal CKE which are far fewer in number than the many (for example, 15) signals used for entering the test mode before the SDRAM is mounted on a board.

After the continuity test mode has been entered by the test mode signal φts having the H level after the power-on, the test mode decision circuit 214 stops the continuity test mode when the continuity test end signal φext having the H level or the normal operation mode detection signal φax is received.

That is, when the continuity test end signal φext or the normal operation mode detection signal φsx is set high, because the H level is held until the power supply is turned off, the SDRAM does not enter the continuity test mode. Accordingly, even if the continuity test mode is entered using the three signals, the continuity test mode is accurately prevented from being entered in normal use.

Although the SDRAM may enter the continuity test mode once before normal operation, a fault of normal operation will not occur because the continuity test mode is reset by detecting the normal operation mode. Further, when the normal operation mode detection signal φsx having the H level is produced before the continuity test mode signal φts is set high, the SDRAM immediately enters the normal operation mode instead of the continuity test mode. Therefore, accidental entry of the continuity test mode is prevented and normal operation is executed smoothly.

(2) After the power supply has been turned on, prior to other normal commands, the normal operation mode recognition circuit 212 detects the PALL command supplied from an external device and produces the normal operation mode detection signal φsx having the H level. Accordingly, the probability of the continuity test mode being incorrectly entered is very low. Also, normal operation is immediately executed based on the PALL command and its subsequent various commands.

(3) The active power supply generation circuit 275 can also be used for a continuity test as well as normal operation. Accordingly, an active power supply generation circuit for the continuity test is not required, and increase of circuit scale is prevented.

Fifth Embodiment

The fifth embodiment is directed to a continuity test performed after an SDRAM has been mounted on board, and to the test mode of the SDRAM itself before the SDRAM is mounted on the board. The fifth embodiment includes a data compression test using a mask function. The data compression test is performed, for example, on an SDRAM provided with the four output terminals DQ0, DQ1, DQ2 and DQ3, for example, by compressing the data output from the output terminals DQ0 and DQ2 provided every other one and the data output from the output terminals DQ1 and DQ3 provided every other one. The mask function selectively masks a group of the adjacent I/O terminals DQ0 and DQ1 and a group of the adjacent I/O terminals DQ2 and DQ3.

First, the data compression test is described. In general, a test in which correct write and read are performed is conducted by writing the same value (H level or L level) to a plurality of memory cells and then reading the written data. At this time, because the read data is simultaneously output from a plurality of output terminals, all of the output terminals need to be connected to a tester. In this case, because the number of connecting terminals increases between the tester and an SDRAM and the number of SDRAMs which can be tested simultaneously by one tester decreases, the test efficiency is low.

Thus, a data compression circuit is provided within the SDRAM. The data compression circuit outputs a signal having the H level or the L level from a predetermined output terminal when the read data from all of the output terminals have the same value (H level or L level). The data compression circuit sets the predetermined output terminal in the high impedance state when at least one value of the read data from each output terminal differs from the value of another read data. By providing the data compression circuit, the tester and all of the output terminals do not need to be connected, and the test efficiency is improved.

The test performed using the data compression circuit is generally called a data compression test. The data compression circuit is provided for a group of the output terminals DQ0 and DQ2 and a group of the output terminals DQ1 and DQ3 respectively. The data compression circuit of the output terminals DQ0 and DQ2 compresses the data to be output from the output terminals DQ0 and DQ2 and supplies the compressed data to the output terminal DQ0. The data compression circuit of the output terminals DQ1 and DQ3 compresses the data to be output from the output terminals DQ1 and DQ3 and supplies the compressed data to the output terminal DQ1.

Next, the mask function is described. In an SDRAM, I/O data is masked by a mask signal. Specifically, for example, a group of adjacent I/O terminals DQ0 and DQ1 and a group of the adjacent I/O terminals DQ2 and DQ3 are selectively masked. A first mask signal φMSK0 is set for the I/O terminals DQ0 and DQ1 and a second mask signal φMSK1 is set for the I/O terminals DQ2 and DQ3. When the first mask signal φMSK0 is high, the input data to the I/O terminals DQ0 and DQ1 and the output data from them are masked. Similarly, when the second mask signal φMSK1 is high, the input data to and the output data from the I/O terminals DQ2 and DQ3 are masked. Accordingly, for example, when the first mask signal φMSK0 is low and the second mask signal φMSK1 is high, the I/O terminals DQ0 and DQ1 are not masked, but the I/O terminals DQ2 and DQ3 are masked.

However, a conventional data compression test cannot be performed using the mask function because the data compression test is performed for a group of every other output terminals DQ0 and DQ2 and a group of every other output terminals DQ1 and DQ3, and the mask function is applied to a group of adjacent I/O terminals DQ0 and DQ1 and a group of adjacent I/O terminals DQ2 and DQ3. In the fifth embodiment, the data compression test mode can be entered using the mask function.

Figure 19:
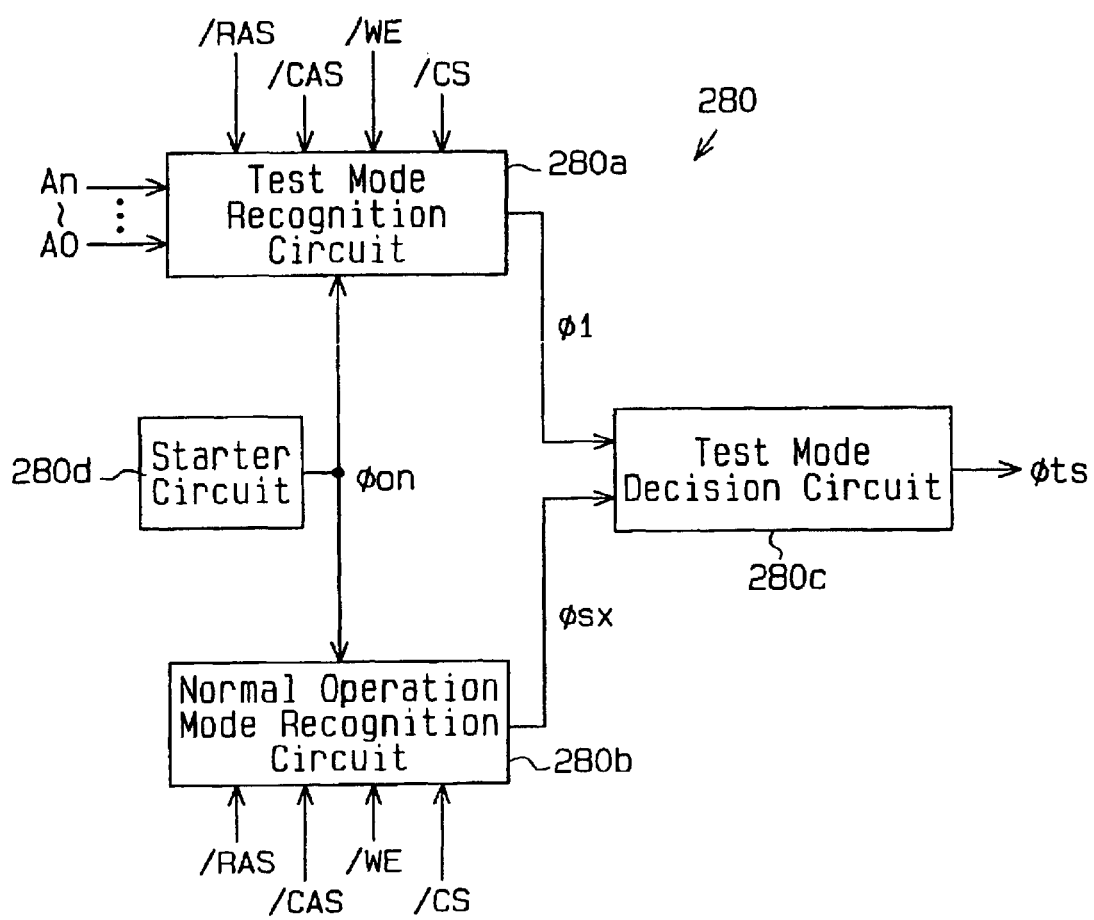
FIG. 19 is a schematic block diagram of a test mode entry circuit according to a fifth embodiment of the present invention.

FIG. 19 is a schematic block diagram of a test mode entry circuit 280 according to the fifth embodiment of the present invention. The test mode entry circuit 280 comprises a test mode recognition circuit 280a, a normal operation mode recognition circuit 280b, a test mode decision circuit 280c and a starter circuit 280d.

The test mode recognition circuit 280a receives an external command comprising the chip selection signal/CS, the row address strobe signal/RAS, the column address strobe signal/CAS and the write enable signal/WE and the memory address signals A0 to An from an external device, and detects whether a combination of these signals is a command of the data compression test mode command. If so, the test mode recognition circuit 280a activats test mode detection signal φ1.

The normal operation mode recognition circuit 280b outputs the normal operation mode detection signal φsx having the H level when the PALL command is supplied from the external device. The test mode recognition circuit 280a and the normal operation mode recognition circuit 280b detect each mode after they have been set in the initial state by the power-on signal φon supplied from the starter circuit 280d.

The test mode decision circuit 280c receives the test mode detection signal φ1 from the test mode recognition circuit 280a and the normal operation mode detection signal q)sx from the normal operation mode recognition circuit 280b, and outputs the test mode signal φts having the H level for execution of the test mode when the test mode detection signal φ1 is supplied before the normal operation mode detection signal φsx having the H level. The test mode decision circuit 280c outputs the test mode signal φts having the L level for non-execution of the test mode regardless of the test mode detection signal φ1 having the L level when the normal operation mode detection signal φsx having the H level is supplied before the test mode detection signal φ1 having the L level.

Figure 20:
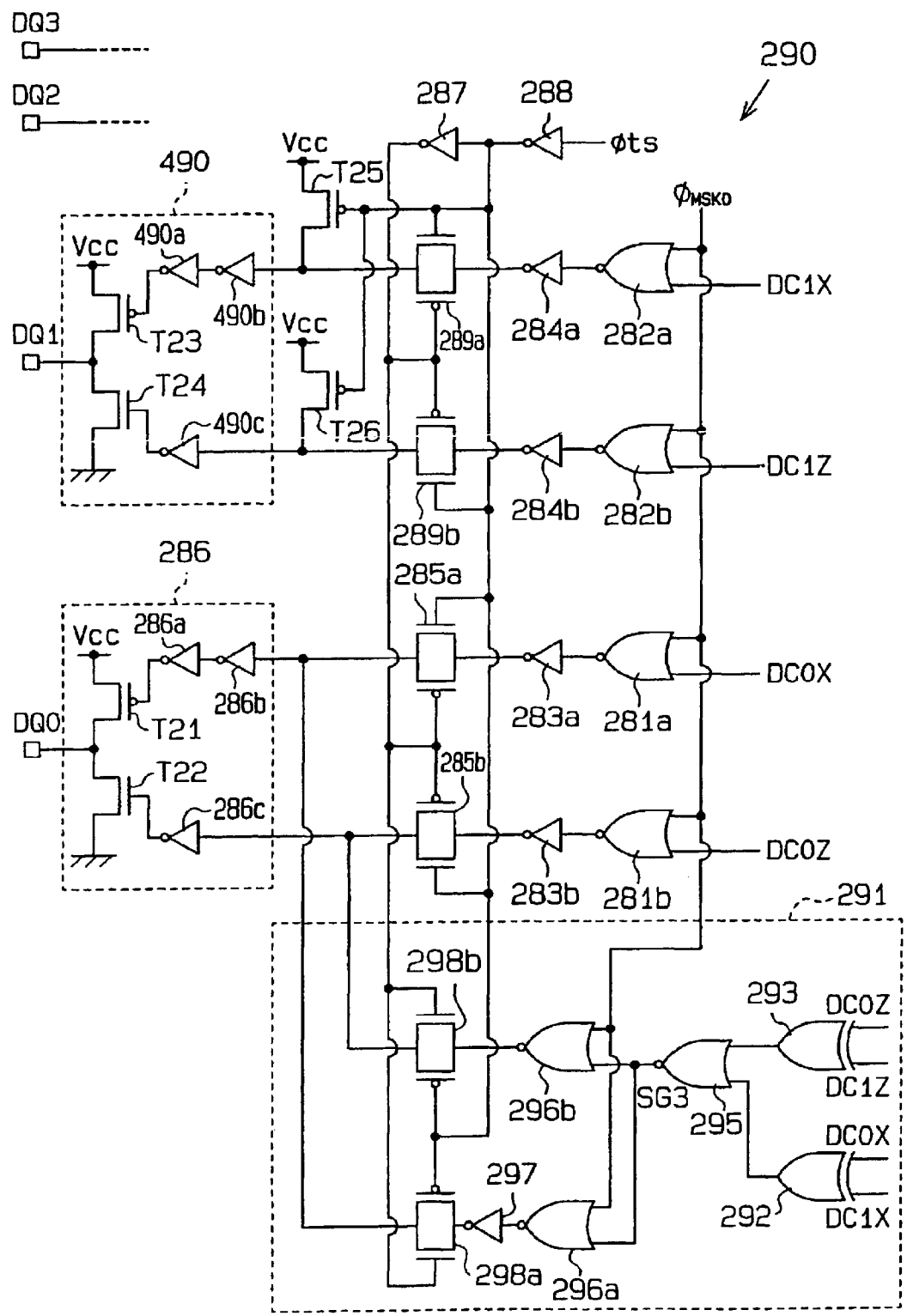
FIG. 20 is a schematic block diagram of an I/O circuit connected to the test mode entry circuit of FIG. 19.

FIG. 20 is a circuit diagram of an I/O circuit 290 of an SDRAM. The I/O circuit 290 is connected to the I/O terminals DQ0 and DQ1 and receives the test mode signal φts and the first data mask φMSK0. In the fifth embodiment, to simplify the description, the SDRAM provided with the four I/O terminals DQ0, DQ1, DQ2 and DQ3 is described. Usually, the SDRAM comprises 16 or 32 I/O terminals. Further, the characteristic output circuit of the I/O circuit 290 is described. Description of the I/O circuits of the I/O terminals DQ2 and DQ3 is omitted since these circuits are understood by those of ordinary skill in the art.

Output data DC0X and DC0Z read from a memory cell are connected to the first input terminals of NOR circuits 281a and 281b respectively and the first data mask φMSK0 is supplied to the second input terminals of the NOR circuits 281a and 281b. The output data DC0X and the output data DC0Z are complementary signals. Output data DC1X and DC1Z output from the memory cell are supplied to the first input terminals of NOR circuits 282a and 282b and the first data mask signal φMSK0 is supplied to the second input terminals of the NOR circuits 282a and 282b. The output data DC1X and the output data DC1Z are complementary signals.

The first data mask signal φMSK0 is supplied from an external device to determine whether write data to a memory cell is input via the I/O terminals DQ0 and DQ1 and that the read data from the memory cell is output. When the first data mask signal φMSK0 is high, the mask mode in which data is not input and output via the I/O terminals DQ0 and DQ1 is entered, and when the first data mask signal φMSK0 is low, the non-mask mode in which data is input and output via the I/O terminals DQ0 and DQ1 is entered.

The second data mask signal φMSK1 (not shown) is also supplied from an external device. However, when the second data mask signal φMSK1 is high, the mask mode in which data is not input and output via the I/O terminals DQ2 and DQ3 is entered, and when the second data mask signal φMSK1 is low, the non-mask mode in which data is input and output via the I/O terminals DQ2 and DQ3 is entered.

Inverter circuits 283a, 283b, 284a and 284b are connected to the output terminals of the NOR circuits 281a, 281b, 282a and 282b respectively, and when the first data mask signal φMSK0 is low (non-mask mode), the inverter circuits 283a, 283b, 284a and 284b output the output data DC0X, DC0Z, DC1X and DC1Z respectively. When the first data mask signal φMSK0 is high (mask mode), the inverter circuits 283a, 283b, 284a and 284b output signals having the H level without outputting the output data DC0X, DC0Z, DC1X and DC1Z.

The inverter circuits 283a and 283b are connected to an output buffer 286 via transfer gates 285a and 285b. Each of the transfer gates 285a and 285b comprises PMOS transistors and NMOS transistors, and the test mode signal φts is supplied to the gates of the PMOS transistors via inverter circuits 287 and 288. The test mode signal φts is supplied to the gates of the NMOS transistors of the transfer gates 285a and 285b via the inverter circuit 288. When the test mode signal φts is high (test mode), the transfer gates 285a and 285b are turned off. Accordingly, when the SDRAM is in the non-test mode and non-mask mode, the output data DC0X and DC0Z are supplied from the inverter circuits 283a and 283b to the output buffer 286. When the SDRAM is in non-test mode and in the mask mode, the inverter circuits 283a and 283b supply signals having the H level to the output buffer 286. When the SDRAM is in the test mode, the output data from the inverter circuits 283a and 283b is not supplied to the output buffer 286 regardless of the mask mode and the non-mask mode.

The output buffer 286 comprises a PMOS transistor T21 and an NMOS transistor T22 connected in series between the external power supply voltage Vcc and a ground voltage. The node between the PMOS transistor T21 and the NMOS transistor T22 is connected to the I/O terminal DQ0. The gate terminal of the PMOS transistor T21 is connected to the output terminal of the transfer gate 285a via inverter circuits 286a and 286b. The gate terminal of the NMOS transistor T22 is connected to the output terminal of the transfer gate 285b via an inverter circuit 286c.

When the data signal DC0X having the H level and the data signal DC0Z having the L level are supplied to the output buffer 286, the PMOS transistor T21 is turned off and the NMOS transistor T22 is turned on. Then a data signal having the L level is output from the I/O terminal DQ0.

The inverter circuits 284a and 284b are connected to an output buffer 490 via transfer gates 289a and 289b. Each of the transfer gates 289a and 289b comprises PMOS transistors and NMOS transistors. The test mode signal φts is supplied to the gate of each PMOS transistor via the inverter circuits 287 and 288. The test mode signal φts is supplied to the gates of each NMOS transistors of the transfer gates 285a and 285b via the inverter circuit 288. The transfer gates 289a and 289b operate in the same manner as the transfer gates 285a and 285b.

When an SDRAM is in the non-test mode and in the non-mask mode, the inverter circuits 284*a* and 284*b* supply the data signals DC1X and DC1Z to the output buffer 290. When the SRAM is in the non-test mode and in the mask mode, the inverter circuits 284*a* and 284*b* supply signals having the H level to the output buffer 490.

When the SDRAM is in the test mode, the output signals from the inverter circuits 284*a* and 284*b* are not supplied to the output buffer 490 regardless of the mask mode and the non-mask mode.

The output buffer 490 comprises a PMOS transistor T23 and an NMOS transistor T24 connected in series between the external power supply voltage Vcc and a ground voltage. The node between the PMOS transistor T23 and the NMOS transistor T24 is connected to the I/O terminal DQ1. The gate terminal of the PMOS transistor T23 is connected to the output terminal of the transfer gate 289*b* via inverter circuits 490*a* and 490*b*. The gate terminal of the NMOS transistor T24 is connected to the output terminal of the transfer gate 289*b* via an inverter circuit 290*c*.

When the data signal DC1X having the H level and the data signal DC1Z having the L level are supplied to the output buffer 490, the PMOS transistor T23 is turned off and the NMOS transistor T24 is turned on, and then a data signal having the L level is output from the I/O terminal DQ1.

The signal line which connects the output buffer 490 and the transfer gate 289*a* is connected to the external power supply voltage Vcc via a PMOS transistor T25. The signal line which connects the output buffer 490 and the transfer gate 289*b* is connected to the external power supply voltage Vcc via a PMOS transistor T26. The test mode signal φts is supplied to each gate of the PMOS transistors T25 and T26 via the inverter circuit 288. When the test mode signal φts is high (test mode), the PMOS transistors T25 and T26 are turned on. The PMOS transistors T25 and T26 function as clamping circuits which clamp signal lines to the H level.

The I/O circuit 290 comprises a data compression circuit 291. The data compression circuit 291 determines whether the data signals to be output from the adjacent I/O terminals DQ0 and DQ1 are the same values and supplies the judgment result to the I/O terminal DQ0. Accordingly, the data compression circuit 291 of the fifth embodiment differs from a conventional data compression circuit unit in that it corresponds to the I/O terminals DQ0 and DQ1 masked by the first data mask signal φMSK0. Another data compression circuit (not shown) is also provided for the remaining two I/O terminals DQ2 and DQ3. This other data compression circuit determines whether the data to be output from the I/O terminals DQ2 and DQ3 are the same values and supplies the judgment result to the I/O terminal DQ2.

The data compression circuit 291 includes first and second exclusive NOR circuits 292 and 293. The first exclusive NOR circuit 292 receives the data signals DC0X and DC1X, and outputs a first EX NOR signal having the L level when the level of the data signal DC0X and the level of the data signal DC1X are the same. When the data signals DC0X and DC1X differ from each other, the first exclusive NOR circuit 292 outputs a first EX NOR signal having the H level.

The second exclusive NOR circuit 293 receives the data signals DC0Z and DC1Z, and outputs a second EX NOR signal having the L level when the level of the data signal DC0Z and the level of the data signal DC1Z are the same. When the data signals DC0Z and DC1Z differ from each other, the second exclusive NOR circuit 293 outputs a second EX NOR signal having the H level.

A NOR circuit 295 receives first and second EX NOR signals from the first and second exclusive NOR circuits 292 and 293, and supplies a NOR signal SG3 having the H level to first and second NOR circuits 296*a* and 296*b* when the level of the first EX NOR signal and the level of the second EX NOR signal are the same. That is, when the level of the data signal supplied to the I/O terminal DQ0 based on the data signals DC0X and DC0Z and the level of the data signal supplied to the I/O terminal DQ1 based on the data signals DC1X and DC1Z are the same, the NOR signal SG3 having the H level is output. When the level of the data signal supplied to the I/O terminal DQ0 and the level of the data signal supplied to the I/O terminal DQ1 do not match, the NOR circuit 295 outputs the NOR signal SG3 having the L level.

The NOR circuit 296*a* receives the NOR signal SG3 and the first data mask signal φMSK0 and its output terminal is connected to an inverter circuit 297. When the first data mask signal φMSK0 is low (non-mask mode), the inverter circuit 297 outputs the NOR signal SG3. When the first data mask signal φMSK0 is high, the inverter circuit 297 outputs a signal having the H level.

The second NOR circuit 296*a* outputs the inverted NOR signal SG3 when the first data mask signal φMSK0 is low (non-mask mode). When the first data mask signal φMSK0 is high (mask mode), the second NOR circuit 296*b* outputs a signal having the L level. That is, in the non-mask mode, when the data supplied to the I/O terminal DQ0 and the data supplied to the I/O terminal DQ1 do not match, the inverter circuit 297 supplies a signal having the L level to a first transfer gate 298*a* and the second NOR circuit 296*b* supplies a signal having the H level to a second transfer gate 298*b*.

In the non-mask mode, when the supply data of the I/O terminal DQ0 and the supply data of the I/O terminal DQ1 match, the inverter circuit 297 outputs a signal having the H level and the second NOR circuit 296*b* outputs a signal having the L level.

In the mask mode, regardless of the NOR signal SG3, the inverter circuit 297 outputs a signal having the H level and the second NOR circuit 296*b* outputs a signal having the L level.

Each of the first and second transfer gates 298*a* and 298*b* comprises PMOS transistors and NMOS transistors. The test mode signal φts is supplied to the gate of each PMOS transistor via the inverter circuit 288. The test mode signal φts is supplied to the gate of each NMOS transistor via the inverter circuits 287 and 288. When the test mode signal φts is high (test mode), the first and second transfer gates 298*a* and 298*b* are turned on. Accordingly, in the test mode, the output signal of the inverter 297 is supplied to the inverter circuit 286*b* of the output buffer 286 and the output signal of the second NOR circuit 296*b* is supplied to the inverter circuit 286*b* of the output buffer 286. At this time, the transfer gates 285*a*, 285*b*, 289*a* and 289*b* are turned off.

In the non-test mode, the outputs of the inverter circuit 297 and the second NOR circuit 296*b* are not supplied to the output buffer 286. At this time, the transfer gates 285*a*, 285*b*, 289*a* and 289*b* are turned on.

For example, when the second data mask signal φMSK1 is high (mask mode) and the first data mask signal φMSK0 is low (non-mask mode), assume the data compression test mode is executed by the test mode signal φts having the H level. In this case, data having the H level is written to a memory cell of a predetermined address via the I/O terminals DQ0 and DQ1. Subsequently, when write data is read, by the test mode signal φts having the H level, the transfer gates 285*a*, 285*b*, 289*a* and 289*b* are turned off and the first and second transfer gates 298*a* and 298*b* are turned on, and then the compression data from the data compression circuit 291 is supplied to the output buffer 286. That is, when the level of the data signal DC0X and the level of the data signal DC1X are the same (the data signal DC0Z and the data signal DC1Z are the same), a signal having the H level is supplied to the output buffer 286 via the first transfer gate 298a and a signal having the L level is supplied to the output buffer 286 via the second transfer gate 298b. Accordingly, a data signal (matching signal) having the L level is output from the I/O terminal DQ0.

When the data signal DC0X and the data signal DC1X do not match mutually (the data signal DC0Z and the data signal DC1Z do not match), a signal having the L level is supplied to the output buffer 286 via the first transfer gate 298a and a signal having the H level is supplied to the output buffer 286 via the second transfer gate 298b. Accordingly, a mismatch signal having the H level is output from the I/O terminal DQ0.

Consequently, as described above, the data compression test mode is executed via the I/O terminals DQ0 and DQ1 using the mask function (state masked for the I/O terminals DQ2 and DQ3). Consequently, the number of terminals of a tester which must be connected to an SDRAM for a test decreases and the number of SDRAMs which can be tested simultaneously by the tester increases.

Next, the characteristics of an SDRAM according to the fifth embodiment are described.

(1) The test mode recognition circuit 280a of the test mode entry circuit 280 makes the SDRAM to enter the data compression test mode using the mask function based on an external command. The SDRAM may enter the data compression test mode only once before normal operation. However, if a normal operation mode is detected, a fault of the normal operation will not occur because the data compression test mode is reset.

Further, when the normal operation mode detection signal φsx having the H level is produced before the test mode signal φts is set high, the SDRAM does not enter the test compression test mode. Rather, the SDRAM immediately enters the normal operation mode and entry into a useless data compression test mode is omitted, and normal operation is executed smoothly.

(2) After the power supply has been turned on, the PALL command is detected prior to other normal commands and the normal operation mode detection signal φsx having the H level is produced. Accordingly, the normal operation is immediately executed based on the PALL command and its subsequent various commands without entering the test mode.

(3) Because an SDRAM may enter the data compression test mode using the mask function before shipment, the test efficiency is improved.

It should be apparent to those skilled in the art that the present invention may be embodied in many other specific forms without departing from the spirit or scope of the invention. Particularly, it should be understood that the invention may be embodied in the following forms.

(a) The test mode control circuit 32 may also be connected to the wiring for an internal memory address signal which extends from the address buffer/register & bank selection circuit 12. The test mode control circuit 32 may also be connected to the wiring between the input buffer for each address signal and the latch circuit within the address buffer/register & bank selection circuit 12. That is, the test mode control circuit 32 may also be provided at a place where the supply path of an address signal can be switched between the normal operation test and the test mode.

(b) The test mode control circuit 32 may also switch three address signal supply paths or more.

(c) The test mode control circuit 32 may also be operated so that the read data signals DQ0 to DQn can be output from output pins which differ from the normal operation mode in the test mode. In this case, the test mode control circuit 32 is connected to the signal line on the output or input side of the I/O data buffer/register 13. As an alternate example, the test mode control circuit 32 may also be connected to the wiring between the output and latch circuit within the I/O data buffer/register 13.

Figure 11:
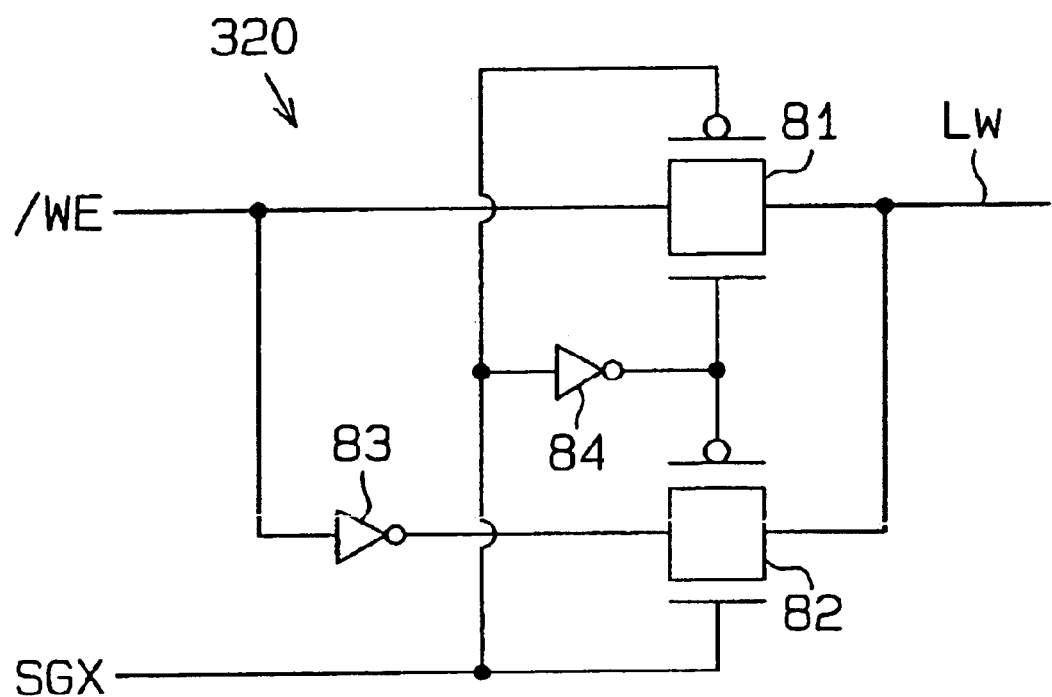
FIG. 11 is a circuit diagram of a control circuit of a test mode decision circuit in accordance with the present invention.

(d) As shown in FIG. 11, the test mode control circuit 320 may also change an external command. A first transfer gate 81 is connected to a signal line Lw for the write enable signal/WE connected to the command decoder 11. A second transfer gate 82 and the series circuit of an inverter circuit 83 are connected to the first transfer gate 81 in parallel. The decision signal SGX is applied to the gate of the PMOS transistor of the first transfer gate 81 and the gate of the NMOS transistor of the second transfer gate 82. The decision signal SGX inverted by an inverter circuit 84 is applied to the gate of the NMOS transistor of the first transfer gate 81 and the gate of the PMOS transistor of the second transfer gate 82.

When the first transfer gate 81 is turned off and the second transfer gate 82 is turned on by the decision signal SGX having the H level, the write enable signal/WE supplied to the input pin P4 is inverted by the inverter circuit 83 and supplied to the command decoder 11. Accordingly, a command which differs from the external command from an external device is supplied to the command decoder 11. That is, for example, a read command which differs from a write command is supplied to the command decoder 11. Accordingly, the user easily recognizes that operation which differs from the expected operation is performed. In this example, the chip selection signal/CS may also be inverted. Further, at least one of the address signals A0 to An or at least one of the I/O data signals DQ0 to DQn may also be inverted.

(e) The test mode control circuit 32 may also change latency. The latency indicates the number of clocks (access time) until the first data is read or written after a read command or write command has been supplied in the normal read and write operations. In this case, if the normal operation test mode is set, the latency is changed. Therefore, the user easily recognizes when a operation which differs from the expected operation is performed.

(f) The test mode control circuit 32 may also change burst length. The burst length is the data length which is continuously read or continuously written in the normal read and write operations. In this case, if the normal operation test mode is set, the burst length is changed. Therefore, the user easily recognizes when an operation which differs from the expected operation is performed.

(g) The test mode control circuit 32, the timer circuit 51 and the mode register 15 may also be controlled by determining a test mode such as an address counter test, for example, except for the test mode in which normal operation can be executed.

(h) The test mode decision circuit 31 of FIG. 1 and the test mode decision circuit 311 of FIG. 5 may also output the decision signal SGX when a write command or other commands are supplied. For example, if the decision signal SGX from the test mode decision circuit 31 is output in accordance with the write command, data is written to a memory cell which differs from the memory cell of the specified address. Accordingly, it is easily recognized that the data written to the memory of the specified address and the data read from the memory cell of the specified address differ. In this case, the test mode control circuit 32 may also be operated as described in each of the aforementioned examples (a) to (f). When the test mode control circuit 32 is provided within the I/O data buffer/register 13, the test mode control circuit 32 is connected between the wiring between the output buffer and the latch circuit.

Figure 12:
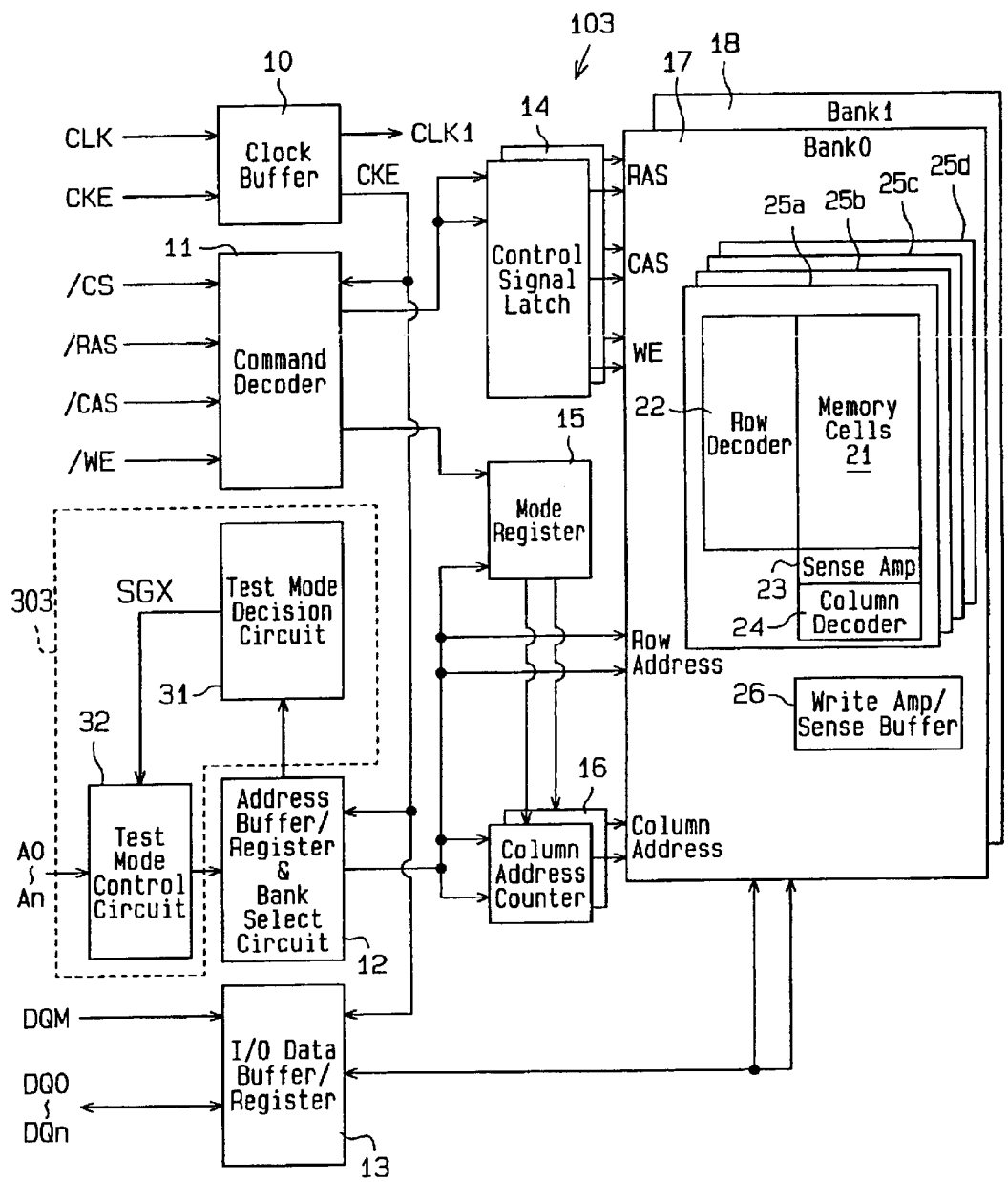
FIG. 12 is a schematic block diagram of an SDRAM in accordance with the present invention.

(i) The test mode decision circuit 31 of the first embodiment receives an external command directly from the input pins P1 to P4, but as shown in FIG. 12, a mode register set command may also be determined by inputting an internal command from the command decoder 11.

Needless to say, the above case may also apply to the test mode decision circuit 31 of the second and third embodiments.

(j) As shown in FIG. 12, the test mode decision circuit 31 may also determine a test mode by receiving the internal memory address signals A0 to An from the address buffer/register & bank selection circuit 12. The test mode decision circuits 311 and 312 of the second and third embodiments may also be prepared as shown in FIG, 12.

(k) The test mode decision circuits 31 and 311 may also output the decision signal SGX having the H level in response to the first decision signal SGX1.

(l) The time when the time-up signal STP is output from the timer circuit 51 per the first to third normal operation test modes may also be changed. In this case, the timer circuit 51 can be provided for each of the latch circuits 67 to 69. A latch signal having the H level of each of the latch circuits 67 to 69 is directly supplied to the corresponding timer circuit as a timing operation start signal.

(m) In the second and third embodiments, the mode register 15 may also reset a test mode in accordance with the time-up signal STP.

(n) A self-refresh counter of the SDRAM 1 may also be used instead of the timer circuit 51. In this case, the self-refresh counter executes a count operation until a predetermined value is obtained in response to the decision signal SGX having the H level. Besides, a counted value may also be changed according to the type of test mode.

(o) In the third embodiment, the timer circuit 51 can be removed.

(p) In the second embodiment, the test mode control circuit 32 may also be omitted.

(q) In the third embodiment, the test mode control circuit 32 may also be added. In this case, for example, it is desirable that the test mode decision circuit 312 should include the second decision circuit 31b. Further, it is desirable that a transfer gate be connected to the output terminal of the inverter circuit 76 of the fourth decision circuit 31d. This transfer gate is turned on and off in accordance with the second decision signal SGX2 from the second decision circuit 31b.

(r) The present invention may also apply to a RAM such as an FCRAM and a semiconductor device such as a ROM and an EEPROM.

(s) The present invention may also apply to a semiconductor device having a test mode such as a signal processor.

(t) If the following normal commands are detected as well as the PALL command, the normal operation mode detection signal φsx having the H level may also be produced. As the normal commands, for example, include a single bank precharge command, a bank active command, a mode register set command, a refresh command, read command or a write command. In particular, it is effective that the command supplied most quickly is used after the power supply has been turned on.

(u) Instead of obtaining the normal operation mode detection signal φsx from the normal operation mode recognition circuit 212, the normal operation mode detection signal φsx may be obtained from the command decoder of the SDRAM.

(v) In the fourth embodiment, the continuity test mode is entered according to a combination of the column address strobe signal/CAS, the chip selection signal/CS and the clock enable signal CKE. Instead, the continuity test mode may also be entered by a combination of part of the three signals and a combination of signals which differ from the three signals/CAS, /CS and CKE. Further, the continuity test mode may also be entered according to a combination of signals which differ from the three signals/CAS, /CS and CKE.

(w) in the fourth embodiment, the continuity test mode may also be entered according to a combination of two or four signals or more. Further, the continuity test mode may also be entered using one signal.

(x) A power generation circuit for the continuity test may also be provided independent of the active power supply generation circuit 275.

(y) The present invention may also apply to a semiconductor memory unit or a semiconductor device provided with the first mode for test and the second mode for other operations.

(z) The first mode for test includes a test which is not performed in normal operation, without setting limits to the continuity test of the fourth embodiment and the data compression test of the fifth embodiment.

Therefore, the present examples and embodiments are to be considered as illustrative and not restrictive and the invention is not to be limited to the details given herein, but may be modified within the scope and equivalence of the appended claims.

What is claimed is:

1. A semiconductor device comprising:
    a first operation mode recognition circuit for producing a first operation mode signal in response to an external signal;
    a second operation mode recognition circuit for producing a second operation mode signal, which is different from the first operation mode signal, in accordance with a command signal; and
    a first operation mode decision circuit, connected to the first operation mode recognition circuit and the second operation mode recognition circuit, for invalidating the first operation mode signal in response to the second operation mode signal until a power-off.

2. The semiconductor device of claim 1, wherein the command signal includes an active command and the external signal is supplied to the semiconductor device before a receipt of the active command, after powered-on.

3. The semiconductor of claim 1, wherein the external signal includes one of an all bank precharge command, a single bank precharge command, a bank active command, a mode register set command, a refresh command, a write command and a read command.

4. The semiconductor device of claim 1, wherein the second operation mode recognition circuit resets the second operation mode signal in response to the power-on and maintains the output of the second operation mode signal until the power-off.

5. The semiconductor device of claim 1, wherein the second operation mode recognition circuit includes a latch circuit which holds the command signal.

6. The semiconductor device of claim 5, wherein the second operation mode recognition circuit includes:
   an external command input terminal; and
   a switch, connected between the external command input terminal and the latch circuit, for disconnecting the external command input terminal from the latch circuit in response to the second operation mode signal.

7. The semiconductor device of claim 1, further comprising:
   an active power supply generation circuit, connected to the first operation mode recognition circuit and the second operation mode recognition circuit, and activated in response to at least one of the first operation mode signal and the second operation mode signal.

8. A semiconductor device comprising:
   a first operation mode recognition circuit for producing a first operation mode signal when a plurality of external signals have the predetermined logic combination;
   a second operation mode recognition circuit for producing a second operation mode signal, which is different from the first operation mode signal, in accordance with a command signal; and
   a first operation mode decision circuit for in validating the first operation mode signal in response to the second operation mode signal until a power-off.

9. The semiconductor device of claim 8, wherein the command signal includes an active command and the external signals are supplied to the semiconductor device before a receipt of the active command after the power-on.

10. The semiconductor of claim 8, wherein the external signal includes a one of an all bank precharge command, a single bank precharge command, a bank active command, a mode register set command, a refresh command, a write command and a read command.

11. The semiconductor device of claim 8, wherein the second operation mode recognition circuit resets the second operation mode signal in response to the power-on and maintains the output of the second operation mode signal until the power-off.

12. The semiconductor device of claim 8, wherein the second operation mode recognition circuit includes a latch circuit which holds the command signal.

13. The semiconductor device of claim 12, wherein the second operation mode recognition circuit includes:
   an external command input terminal; and
   a switch, connected between the external command input terminal and the latch circuit, for disconnecting the external command input terminal from the latch circuit in response to the second operation mode signal.

14. The semiconductor device of claim 8, further comprising:
   an active power supply generation circuit, connected to the first operation mode recognition circuit and the second operation mode recognition circuit, and activated in response to at least one of the first operation mode signal and the second operation mode signal.

15. The semiconductor device of claim 8, wherein the first operation mode recognition circuit generates the first operation mode signal when the plurality of external signals having the predetermined logical combination are supplied until the command signal is supplied to the second operation mode recognition circuit.

* * * * *